(12) United States Patent
Garcia et al.

(10) Patent No.: US 9,917,368 B2
(45) Date of Patent: Mar. 13, 2018

(54) ANTENNA-IN-PACKAGE STRUCTURES WITH BROADSIDE AND END-FIRE RADIATIONS

(71) Applicant: International Business Machines Corporation, Armonk, NY (US)

(72) Inventors: Alberto V. Garcia, Hartsdale, NY (US); Xiaoxiong Gu, White Plains, NY (US); Duixian Liu, Scarsdale, NY (US)

(73) Assignee: International Business Machines Corporation, Armonk, NY (US)

( * ) Notice: Subject to any disclaimer, the term of this patent is extended or adjusted under 35 U.S.C. 154(b) by 279 days.

(21) Appl. No.: 14/796,100

(22) Filed: Jul. 10, 2015

(65) Prior Publication Data
US 2016/0056544 A1     Feb. 25, 2016

Related U.S. Application Data

(63) Continuation of application No. 14/565,616, filed on Dec. 10, 2014, which is a continuation-in-part of application No. 14/023,995, filed on Sep. 11, 2013.

(51) Int. Cl.
*H01Q 9/04* (2006.01)
*H01Q 21/28* (2006.01)
(Continued)

(52) U.S. Cl.
CPC ......... *H01Q 9/0407* (2013.01); *G06K 19/077* (2013.01); *G06K 19/07749* (2013.01); *H01Q 1/38* (2013.01); *H01Q 19/30* (2013.01); *H01Q 21/28* (2013.01); *H01Q 23/00* (2013.01); *H01L 24/13* (2013.01); *H01L 24/16* (2013.01); *H01L 24/17* (2013.01); *H01L 24/32* (2013.01);

*H01L 24/33* (2013.01); *H01L 2224/131* (2013.01); *H01L 2224/16225* (2013.01);
(Continued)

(58) Field of Classification Search
CPC .................................................... H01Q 9/0407
USPC ......................................................... 343/725
See application file for complete search history.

(56) References Cited

U.S. PATENT DOCUMENTS 5,165,109 A * 11/1992 Han ..................... H01Q 9/0457
343/700 MS
6,218,989 B1     4/2001 Schneider et al.
(Continued)

FOREIGN PATENT DOCUMENTS

JP     2012523802 A     10/2012
JP     2012523803 A     10/2012

OTHER PUBLICATIONS

S. Agarwal et al., "Concurrent 85 GHz/94GHz Slotted Gap Coupled Parasitic Microstrip Antenna for Millimeter Wave Applications," IEEE National Conference on Communications (NCC), Feb. 2013, 5 pages, New Delhi, India.
(Continued)

*Primary Examiner* — Dameon E Levi
*Assistant Examiner* — Walter Davis
(74) *Attorney, Agent, or Firm* — Vazken Alexanian; Ryan, Mason & Lewis, LLP

(57) ABSTRACT

Package structures are provided having antenna-in-packages that are integrated with semiconductor RFIC (radio frequency integrated circuit) chips to form compact integrated radio/wireless communications systems that operate in the millimeter wave (mmWave) frequency range with radiation in broadside and end-fire directions.

5 Claims, 17 Drawing Sheets

(51) Int. Cl.
*H01Q 1/38* (2006.01)
*H01Q 19/30* (2006.01)
*H01Q 23/00* (2006.01)
*G06K 19/077* (2006.01)
*H01L 23/00* (2006.01)

(52) U.S. Cl.
CPC ............... *H01L 2224/16227* (2013.01); *H01L 2224/17517* (2013.01); *H01L 2224/32013* (2013.01); *H01L 2224/32014* (2013.01); *H01L 2224/32225* (2013.01); *H01L 2224/33181* (2013.01); *H01L 2224/73204* (2013.01); *H01L 2224/73253* (2013.01); *H01L 2924/15321* (2013.01); *H01L 2924/15322* (2013.01)

(56) References Cited

U.S. PATENT DOCUMENTS

| | | | |
|---|---|---|---|
| 6,518,931 | B1 | 2/2003 | Sievenpiper |
| 7,109,947 | B2 | 9/2006 | Alexopoulos et al. |
| 7,385,555 | B2 * | 6/2008 | Mahmoud ............... H01Q 1/28 343/700 MS |
| 7,423,606 | B2 | 9/2008 | Knadle, Jr. et al. |
| 7,518,221 | B2 | 4/2009 | Gaucher et al. |
| 7,522,105 | B1 | 4/2009 | LaComb |
| 7,528,788 | B2 | 5/2009 | Dunn et al. |
| 7,545,329 | B2 | 6/2009 | Gaucher et al. |
| 7,841,076 | B2 | 11/2010 | Fujii |
| 7,924,227 | B2 | 4/2011 | Yamada |
| 8,059,034 | B2 | 11/2011 | Ly et al. |
| 8,160,530 | B2 | 4/2012 | Corman et al. |
| 8,319,689 | B2 | 11/2012 | Kim et al. |
| 2007/0063056 | A1 * | 3/2007 | Gaucher ............. H01L 23/4334 235/492 |
| 2008/0198082 | A1 | 8/2008 | Soler Castany et al. |
| 2009/0015483 | A1 * | 1/2009 | Liu ..................... H01Q 9/0457 343/700 MS |
| 2010/0327068 | A1 | 12/2010 | Chen et al. |
| 2011/0133991 | A1 | 6/2011 | Lee et al. |
| 2012/0149300 | A1 | 6/2012 | Forster |
| 2012/0212384 | A1 | 8/2012 | Kam et al. |
| 2013/0088391 | A1 | 4/2013 | Corman et al. |

OTHER PUBLICATIONS

List of IBM Patents or Patent Applications Treated as Related.

* cited by examiner

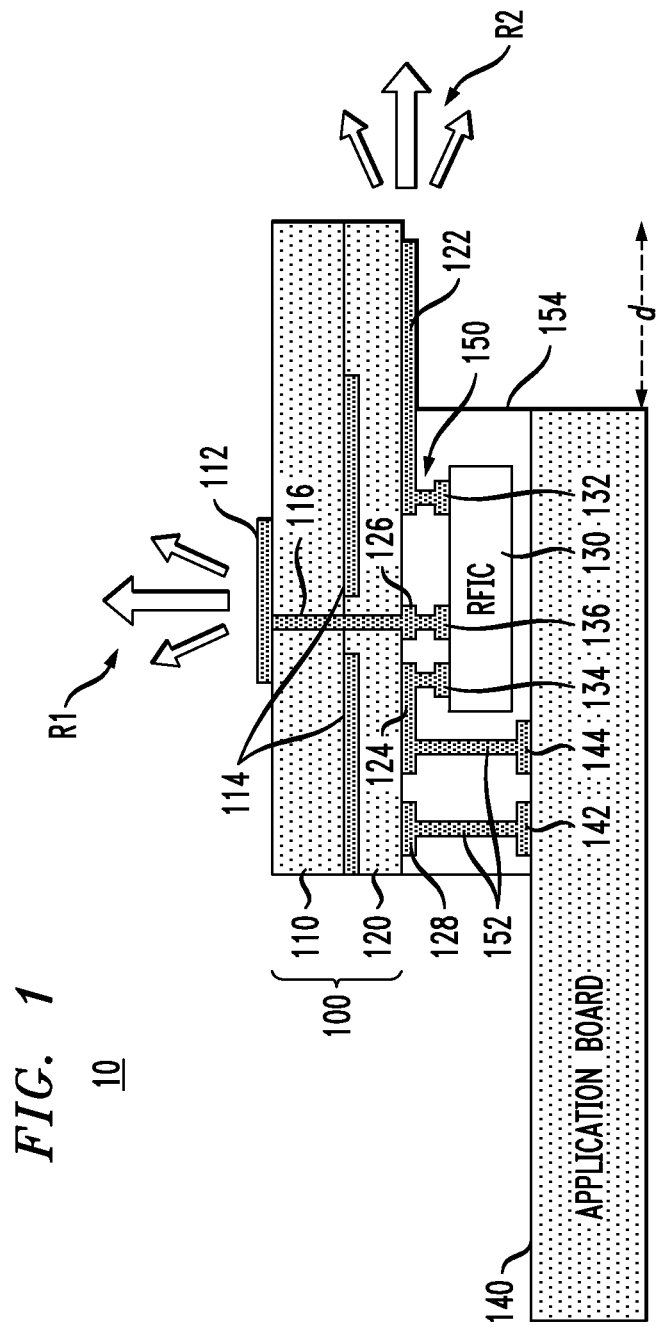

300

400

600

1000

1110

1200

1300

1600

1700

ANTENNA-IN-PACKAGE STRUCTURES WITH BROADSIDE AND END-FIRE RADIATIONS

CROSS-REFERENCE TO RELATED APPLICATIONS

This application is a Continuation of U.S. patent application Ser. No. 14/565,616, filed on Dec. 10, 2014, which is a Continuation-in-Part of U.S. patent application Ser. No. 14/023,995, filed on Sep. 11, 2013, the disclosures of which are fully incorporated herein by reference.

STATEMENT REGARDING FEDERALLY SPONSORED RESEARCH OR DEVELOPMENT

This invention was made with Government support under Contract No. FA8650-09-C-7924 (awarded by the Advanced Research Development Agency). The Government has certain rights in this invention.

TECHNICAL FIELD

The field generally relates to package structures with integrated antennas and, in particular, package structures having antenna-in-packages integrated with semiconductor RFIC (radio frequency integrated circuit) chips to form compact integrated radio/wireless communications systems that operate in the millimeter wave (mmWave) frequency range with radiation in broadside and end-fire directions.

BACKGROUND

There is an increasing demand for low-cost wireless communication systems that operate in the 60-GHz frequency band and which support gigabit-per-second (Gbps) data rates. Typical applications that demand Gbps data rates include, for example, wireless gigabit Ethernet and wireless uncompressed high-definition video applications. This technology allows users to wirelessly link portable devices such as electronic tablets and smartphones to computers, kiosks, high-definition displays and projectors, for example, with data rates that are thousands of times faster than standard Bluetooth or Wireless LAN protocols. Recent advances in CMOS and SiGe technologies have enabled single chip solutions, making the 60-GHz technology more commercially attractive. However, for the 60-GHz market to flourish, not only are low-cost device solutions required, but also low-cost RFIC packages with integrated antennas.

SUMMARY

Embodiments of the invention include structures and methods for integrally packaging antenna structures with semiconductor RFIC chips to form compact integrated radio/wireless communications systems that operate in the millimeter wave frequency range with radiation in broadside and end-fire directions.

In one embodiment of the invention, a package structure includes an antenna package and an RFIC (radio frequency integrated circuit) chip mounted to antenna package. The antenna package includes a stack structure, wherein stack structure includes a plurality of substrates and metallization layers comprising a first metallization layer formed on a first surface of a first substrate, and a second metallization layer formed on first surface of a second substrate. The first metallization layer includes a first planar antenna and a planar parasitic element disposed adjacent to the first planar antenna. The second metallization layer includes a second planar antenna. The RFIC chip is mounted to the second metallization layer of antenna package. The first antenna is connected to the RFIC chip by a first antenna feed line comprising a metalized via hole that is formed through the stack structure, and wherein the second antenna is connected to the RFIC chip by a second antenna feed line that is formed as part of the second metallization layer. The first planar antenna is configured to receive or transmit broadside signals and the second planar antenna is configured to receive or transmit end-fire signals. The planar parasitic element is configured to reduce surface waves on the surface of the first substrate.

In another embodiment of the invention, an antenna package includes a first substrate, a second substrate bonded to the first substrate using a first adhesive layer, and a third substrate bonded to the second substrate using a second adhesive layer. The first substrate includes a first metallization layer disposed on a surface of the first substrate, wherein the first metallization layer comprises a first planar antenna and an ungrounded planar parasitic element disposed adjacent to the first planar antenna. The first planar antenna is configured to receive or transmit broadside signals, and the ungrounded planar parasitic element is configured to reduce surface waves on the surface of the first substrate. The second substrate includes a second metallization layer disposed on a surface of the second substrate, wherein the second metallization layer comprises a dedicated power plane to distribute DC power supply voltage. The third substrate includes a third metallization layer formed on first surface of the third substrate and a fourth metallization layer formed on a second surface of the third substrate. The third metallization layer comprises a dedicated ground plane. The fourth metallization layer comprises a plurality of contact pads, one or more antenna feed lines, and a second planar antenna, wherein the second planar antenna is configured to transmit or receive end-fire signals. The antenna package further includes a plurality of metalized via holes formed through the first, second and third substrates to provide one or more antenna feed lines from contact pads of the fourth metallization layer to the first planar antenna. In addition, a plurality of metalized via holes are formed through the second and third substrates to provide connections from contact pads of the fourth metallization layer to the power plane of the second metallization layer, and a plurality of metalized via holes formed through the third substrate to provide connections from contact pads of the fourth metallization layer to the ground plane of the third metallization layer.

In yet another embodiment of the invention, an antenna package includes a first substrate, and a second substrate bonded to the first substrate using an adhesive layer. The first substrate includes a first metallization layer disposed on a first surface of the first substrate and a second metallization layer disposed on a second surface of the first substrate. The first metallization layer includes a first planar antenna, a grounded planar parasitic element disposed adjacent to the first planar antenna, and a power supply patch. The first planar antenna is configured to receive or transmit broadside signals. The grounded planar parasitic element is configured to reduce surface waves on the surface of the first substrate. The power supply patch is configured to distribute a DC power supply voltage. The second metallization layer includes a capacitively coupled ground plane. The second substrate includes a third metallization layer disposed on a first surface of the second substrate, wherein the third metallization layer comprises a dedicated ground plane. The capacitively coupled ground plane is coupled to the dedicated ground plane through the adhesive layer. The second substrate includes a fourth metallization layer formed on second surface of the second substrate, wherein the fourth metallization layer includes a plurality of contact pads, one or more antenna feed lines, and a second planar antenna. The second planar antenna is configured to transmit or receive end-fire signals. The antenna package further includes a plurality of metalized via holes formed through the first and second substrates to provide one or more antenna feed lines from contact pads of the fourth metallization layer to the first planar antenna, and to provide connections from contact pads of the fourth metallization layer to the power supply patch of the first metallization layer. In addition, a plurality of metalized via holes are formed through the first substrate to provide connections from the grounded planar parasitic element of the first metallization layer to the capacitively coupled ground plane of the second metallization layer, and a plurality of metalized via holes are formed through the second substrate to provide connections from contact pads of the fourth metallization layer to the ground plane of the third metallization layer.

These and other embodiments of invention will be described or become apparent from the following detailed description of embodiments, which is to be read in conjunction with the accompanying drawings.

BRIEF DESCRIPTION OF THE DRAWINGS

FIG. 1 schematically depicts a wireless communications package according to an embodiment of the invention.

DETAILED DESCRIPTION

Figure 2A:
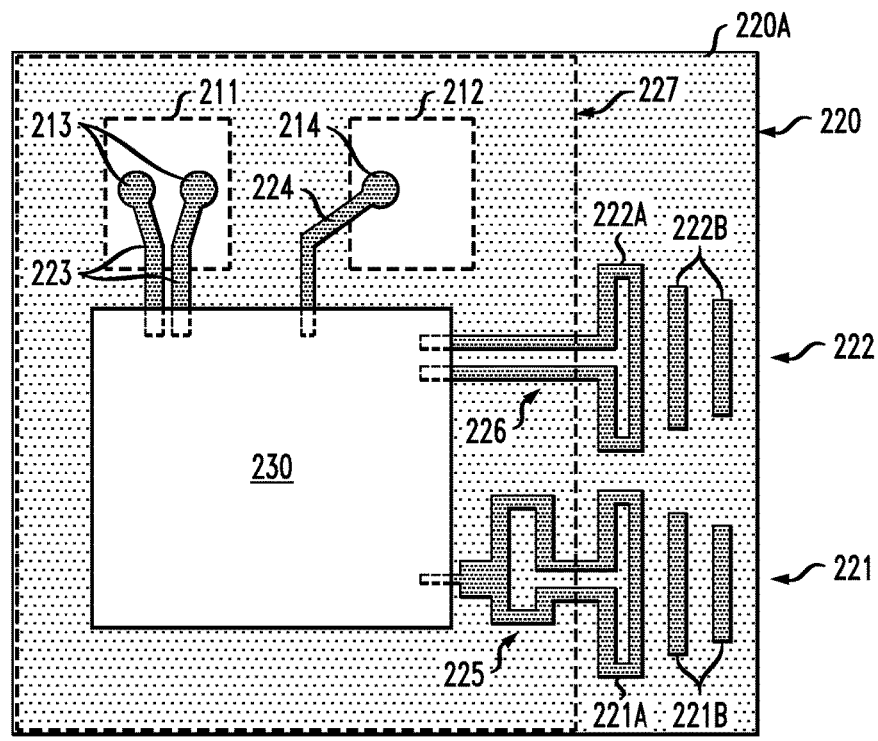
FIGS. 2A and 2B schematically depict an antenna package according to an embodiment of the invention.

Embodiments of the invention will now be discussed in further detail with regard to structures and methods for integrally packaging antenna structures with semiconductor RFIC chips to form compact integrated radio/wireless communications systems that operate in the millimeter wave frequency range with radiation in broadside and end-fire directions. It is to be understood that the various layers, structures, and regions shown in the accompanying drawings are not drawn to scale, and that one or more layers, structures, and regions of a type commonly used in integrated antenna and chip packages may not be explicitly shown in a given drawing. This does not imply that the layers, structures and regions not explicitly shown are omitted from the actual integrated chip packages. Moreover, the same or similar reference numbers used throughout the drawings are used to denote the same or similar features, elements, or structures, and thus, a detailed explanation of the same or similar features, elements, or structures will not be repeated for each of the drawings.

FIG. 1 schematically depicts a wireless communications package 10 according to an embodiment of the invention. In general, the wireless communications package 10 comprises an antenna-in-package 100 (or "antenna package"), an RFIC chip 130, and an application board 140. The antenna package 100 comprises a first substrate 110 and a second substrate 120. The first substrate 110 comprises a first antenna 112 and an antenna ground plane 114, which are formed on opposing sides of the first substrate 110. The second substrate 120 comprises a second antenna 122 and other metallization patterns 124, 126 and 128 formed on a surface thereof, which include contact pads 126, electrical wiring, etc. An antenna feed line 116 is formed through the first and second substrates 110 and 120 in electrical contact with the first antenna 112 and the metallization pattern 126.

In one embodiment of the invention, the substrates 110 and 120 are formed of standard FR4 material with copper metallization, or other suitable materials commonly used to construct a standard PCB (printed circuit board), or other substrate materials that may be otherwise selected to achieve a desired or optimal performance. The substrates 110 and 120 can be formed with other materials having mechanical and electrical properties that are similar to FR4, providing a relatively rigid structure to support the antenna package 100 structure. Depending on the application frequency and other factors related to the type of planar antenna structures used, the substrates 110 and 120 can each have a thickness in a range of about 1 mil to about 20 mils.

The RFIC chip 130 comprises a plurality of metallization patterns 132, 134 and 136 formed on an active side thereof, which include contact pads, electrical wiring, etc. The RFIC chip 130 comprises RFIC circuitry and electronic components formed on the active side including, for example, a receiver, a transmitter or a transceiver circuit, and other active or passive circuit elements that are commonly used to implement wireless RFIC chips. The metallization patterns 132, 134 and 136 of the RFIC chip 130 include, for example, ground pads, DC power supply pads, input/output pads, control signal pads, etc., which are formed as part of a BEOL (back end of line) wiring structure that is connected to integrated circuit components of the RFIC chip 130, as is readily understood by those of ordinary skill in the art. The RFIC chip 130 is flip-chip mounted to the second substrate 120 of the antenna package 100 using controlled collapse chip connections (C4) 150, or other known techniques.

Moreover, the application board 140 comprises a plurality of metallization patterns 142 and 144 formed on a surface thereof, which include contact pads, wiring, etc. The antenna package 100 is connected to the application board 140 using ball grid array (BGA) connections 152, or other known techniques. An under fill material 154 is used to strengthen the C4 connections 150 and BGA connections 152.

In the embodiment of FIG. 1, the second substrate 120 serves as an interface between the RFIC chip 130 and the application board 140 via the C4 connections 150 and BGA connections 152. In particular, some BGA connections 152 may be non-electrical connections that merely serve to bond the antenna package 100 to the application board 140. Similarly, some C4 connections 150 may be non-electrical connections that merely serve to bond the RFIC chip 130 to the antenna package 100. For example, the BGA connection 152 between the metallization patterns 128 and 142 can serve as a non-electrical, bonding connection.

Other BGA connections 152 and C4 connections 150 serve as bonding connections, as well as electrical connections between the application board 140 and the RFIC chip 130. For instance, in the embodiment of FIG. 1, the C4 connection 150 and BGA connection 152 between the metallization patterns 134, 144, and 124 can form a power interconnect to supply DC power from the application board 140 to the RFIC chip 130, or otherwise provide an I/O interconnect to transmit I/O or control signals between the RFIC chip 130 and the application board 140, etc. Moreover, some C4 connections 150 serve as bonding connections, as well as electrical connections between the RFIC chip 130 and the antenna package 100. For instance, in the embodiment of FIG. 1, the C4 connection 150 between the metallization patterns 126 and 136 electrically connect an integrated circuit of the RFIC chip 130 with the antenna feed line 116, and can form a part of the antenna feed line. Moreover, the C4 connection 150 between the metallization pattern 132 and the second antenna 122 metallization can form part of an antenna feed line that feeds the second antenna 122.

In the embodiment of FIG. 1, the wireless communications package 10 provides broadside radiation R1 via the first antenna 112 (wherein the primary radiation beam is perpendicular to the application board 140), as well as end-fire radiation R2 via the second antenna 122 (wherein the primary radiation beam is parallel to the application board 140). As shown in FIG. 1, the antenna package 100 is mounted to the application board 140 so that an edge region of the antenna package 100 extends at some distance, d, past an edge of the application board 140. This mounting technique allows the second antenna 122 on the bottom of the second substrate 120 to be disposed away from other structures and components of the wireless communications package 10, which prevents the radiation properties of the second antenna 122 from being adversely affected by the other structures and components of the wireless communications package 10.

The wireless communications package 10 can support 60 GHz antenna-in-package solutions, for example, for either single antenna or phased-array applications for portable application such as electronic tablets and smart phones. Indeed, for portable applications, the combination of broadside and end-fire radiation improves wireless performance and reduces specific absorption rate (SAR), an important health concern, especially with switchable antenna beams. While the antenna package 100 is shown as being formed with two separate substrates 110 and 120, an antenna package can be formed with one substrate. However, a single substrate design can make the antenna package 100 larger in size, which may not be suitable for portable applications where small size is desired.

Although the first and second antennas 112 and 122 are depicted generically in FIG. 1, the first and second antennas 112 and 122 can be implemented using known antenna structures. For example, for broadside radiation, the first antenna 112 can be a planar patch antenna or a cavity antenna. For end-fire radiation, the second antenna 122 can be a Yagi antenna, a tapered-slot antenna, a dipole antenna, a folded dipole antenna, or a Vivaldi antenna, for example. Various antenna package structures with antennas providing broadside and end-fire radiation will now be discussed in further detail with reference to FIGS. 2A/2B, 3A/3B, 4, 5, 6A/6B, 7A/7B, 8A/8B, and 9.

Figure 2B:
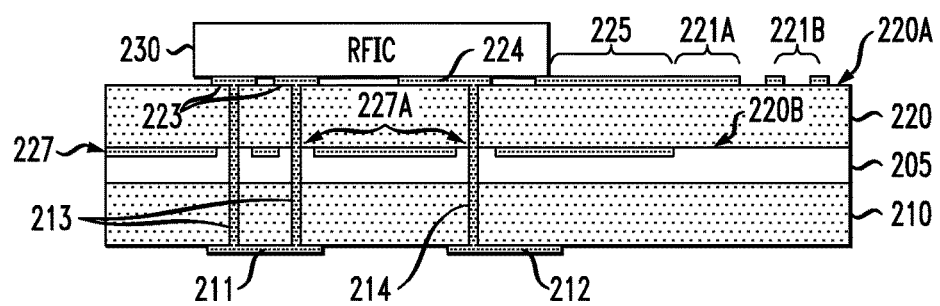

For example, FIGS. 2A and 2B schematically depict an antenna package 200 according to an embodiment of the invention, wherein FIG. 2A is a schematic top view of the antenna package 200, and FIG. 2B is a schematic side view of the antenna package 200. In general, the antenna package 200 comprises a first substrate 210, a second substrate 220, and an RFIC chip 230 that is flip-chip mounted to a first surface 220A of the second substrate 220. The first substrate 210 and second substrate 220 are bonded together using an adhesive layer 205 (or prepreg). The first substrate 210 comprises a first patch antenna 211 and a second patch antenna 212 formed on a surface thereof. The second substrate 220 comprises a first Yagi-Uda (Yagi) antenna 221 and a second Yagi antenna 222 formed on the first surface 220A thereof. The first and second Yagi antennas 221 and 222 each comprise a respective driven element 221A and 222A (e.g., folded dipole element) and respective parasitic elements 221B and 222B (e.g. director elements). The ground plane 227 serves as a reflector element for the first and second Yagi antennas 221 and 222.

In the embodiment of FIGS. 2A/2B, the first and second patch antennas 211 and 212 are used for transmitting and receiving broadside radiation, while the first and second Yagi antennas 221 and 222 are used for receiving and transmitting end-fire radiation.

The antenna package 200 further comprises a plurality of feed lines that connect the RFIC chip 230 to the antennas 211, 212, 221, and 222. In particular, a first antenna feed line 213/223 feeds the first patch antenna 211, a second antenna feed line 214/224 feeds the second patch antenna 212, a third antenna feed line 225 feeds the first Yagi antenna 221, and a fourth antenna feed line 226 feeds the second Yagi antenna 222. A ground plane 227 is formed on second surface of the second substrate 220 opposite the first on which the first and second Yagi antennas 221 and 222 are formed. In many 60 GHz applications, for example, transmitting antennas use differential feed lines, while receiving antennas use single-ended feed lines.

In this regard, in one embodiment of the invention, the first patch antenna 211 operates as a transmitting antenna in the broadside direction, which is fed by a differential antenna feed line, while the second patch antenna 212 operates as a receiving antenna in the broadside direction, which is fed by a single-ended antenna feed line. In particular, the first antenna feed line 213/223 comprises a differential vertical probe portion 213, and a planar differential line portion 223. The differential vertical probe portion 213 is connected to the first patch antenna 211 and extends through the first and second substrates 210 and 220. The planar different line portion 223 is formed on the surface 220A of the second substrate 220 and is connected to the RFIC chip 230.

The second antenna feed line 214/224 comprises a single vertical probe portion 214, and a single planar line portion 224. The single vertical probe portion 214 is connected to the second patch antenna 212 and extends through the first and second substrates 210 and 220. The single planar line portion 224 is formed on the surface 220A of the second substrate 220 and is connected to the RFIC chip 230. In other embodiments of the invention, a single-ended patch antenna (with a single-ended feed point) can be differentially fed by using a BALUN to transform the single-ended feed point to a differential feed, and thereby provide a differentially fed patch antenna having only one feed point attached to the patch antenna.

Furthermore, in one embodiment of the invention, the first Yagi antenna 221 operates as a receiving antenna in the end-fire direction, which is feed by a single-ended antenna feed line, while the second Yagi antenna 222 operates as a transmitting antenna in the end-fire direction, which is feed by a differential antenna feed line. In particular, the third antenna feed line 225 is a BALUN that is formed on the first surface 220A of the second substrate 200 connecting the first Yagi antenna 221 to the RFIC chip 230, wherein the BALUN transforms the natural differential input of the first Yagi antenna 221 to a single-ended feed. Moreover, the fourth antenna feed line 226 is a planar balanced differential feed line that is formed on the surface 220A of the second substrate 220 connecting the second Yagi antenna 222 to the RFIC chip 230.

In one embodiment of the invention, the differential vertical probe portion 213 and the single vertical probe portion 214 of the antenna feed lines are metallized via holes that are formed in the first and second substrates 210 and 220 in vertical alignment with each other. The ground plane 227 formed on the second surface 220B of the second substrate 220 comprises a plurality of etched openings 227A through which the vertical probe portions 213 and 214 can pass and remain electrically isolated from the ground plane 227. The ground plane 227 operates as an antenna ground plane for the first and second patch antennas 211 and 212, and serves as a ground plane for the planar antenna feed lines 223, 224, 225 and 226 that are formed on the first surface 220A of the second substrate 220, and further serves as the reflector element of the first and second Yagi antennas 221 and 222. The ground plane 227 is formed on the entire area of the second surface 220B of the second substrate 220 except for the area under the first and second Yagi antennas 221 and 222.

As in the generic embodiment shown in FIG. 1, the antenna package 200 of FIGS. 2A/2B can be mounted to an application board using BGA connections between the first surface 220A of the second substrate 220 and the application board, with the portion of the antenna package 200 having the first and second Yagi antennas 221 and 222 extending past an edge of the application board. In such instance, as noted above, the first and second patch antennas 211 and 212 facing away from the application board would be used for transmitting and receiving broadside radiation, while the first and second Yagi antennas 221 and 222 (disposed past the edge of the application board) would be used for receiving and transmitting end-fire radiation.

Further, in one embodiment of the invention, the first patch antenna 211 and second Yagi antenna 222 (transmitting antennas) can be independently operated to transmit radiation in only one of the broadside or end-fire directions, or in both directions at the same time. Moreover, the first patch antenna 211 and second Yagi antenna 222 can be operated as a two-element phased array antenna to steer the transmitting radiation beam in a given direction between the broadside and end-fire directions, using beam steering techniques well-known to those of ordinary skill in the art.

In another embodiment of the invention, the broadside patch antennas 211 and 212, for example, can both be transmitting antennas that are configured as a mini phased array antenna with beam steering control. In yet another embodiment, one or more additional patch antennas can be formed on the first substrate 210 (in addition to the first and second patch antennas 211 and 212), where the additional patch antenna operates as a receiving antenna, while the broadside transmitting patch antennas 211 and 212 are configured as a phased array antenna. In another embodiment of the invention, the broadside patch antennas 211 and 212 can be connected to a transceiver circuit and alternatively operated as transmitting and receiving antennas using a transceiver switch with a time-division multiplexing (TDM) scheme, as is understood by those of ordinary skill in the art.

Figure 3A:
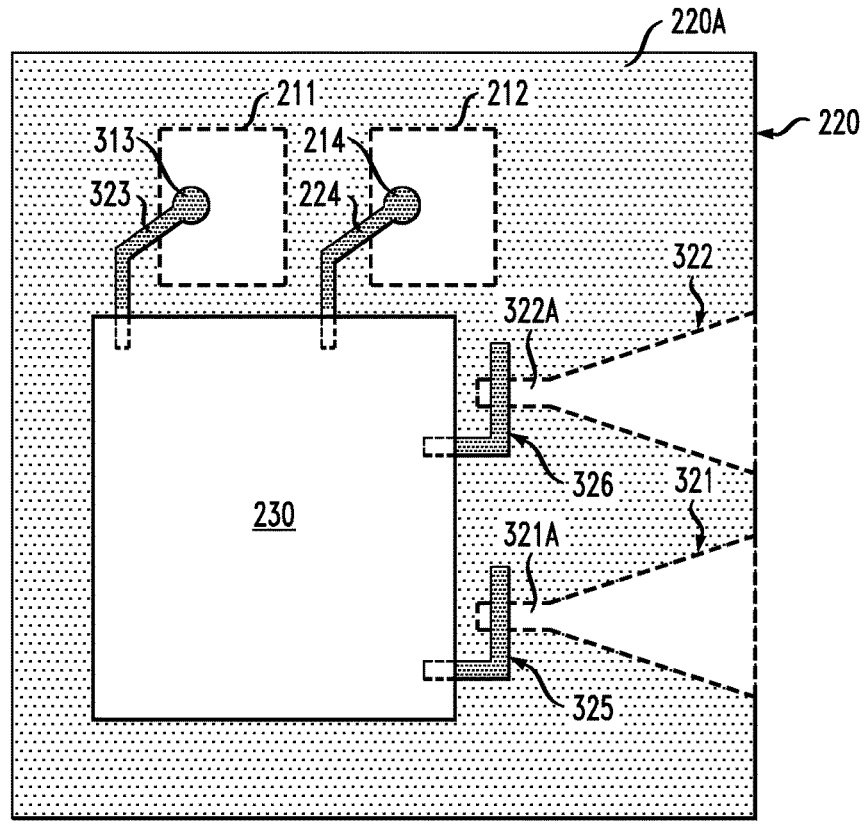
FIGS. 3A and 3B schematically depict an antenna package according to another embodiment of the invention.
Figure 3B:
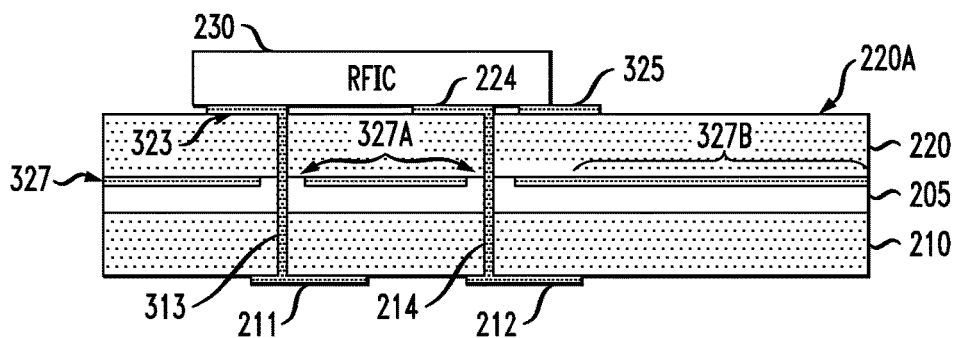

FIGS. 3A and 3B schematically depict an antenna package 300 according to an embodiment of the invention, wherein FIG. 3A is a schematic top view of the antenna package 300, and FIG. 3B is a schematic side view of the antenna package 300. The antenna package 300 is similar to the antenna package 200 discussed above with reference to FIGS. 2A and 2B, except that the first patch antenna 211 is fed with a single-ended antenna feed line 313/323 which comprises a single vertical probe portion 313, and a single planar line portion 323. The single vertical probe portion 313 is connected to the first patch antenna 211 and extends through the first and second substrates 210 and 220. The single planar line portion 323 is formed on the surface 220A of the second substrate 220 and is connected to the RFIC chip 230.

Furthermore, the antenna package 300 comprises a ground plane 327 having etched portions 327A to electrically isolate the vertical probe portions 214 and 313 of the antenna feed lines from the ground plane 327. Further, the ground plane 327 comprises an area 327B that is patterned/etched to form a first tapered-slot antenna 321 and a second tapered-slot antenna 322, with single ended feeds. In particular, first and second L-shaped feed lines 325 and 326 are formed on the first surface 220A of the second substrate 220. The first L-shaped feed line 325 couples electromagnetic energy to and from an input slot portion 321A of the first tapered-slot antenna 321, and the second L-shaped feed line 326 couples electromagnetic energy to and from an input slot portion 322A of the second tapered-slot antenna 322. The first and second tapered-slot antennas 321 and 322 are used for transmitting or receiving end-fire radiation. In other embodiments of the invention, the first L-shaped feed line 325 and/or the second L-shaped feed line 326 can be connected to a BALUN as needed, if the first tapered-slot antenna 321 and/or the second tapered-slot antenna 322 are connected to a differential-feed transceiver in the RFIC chip 230.

Figure 4:
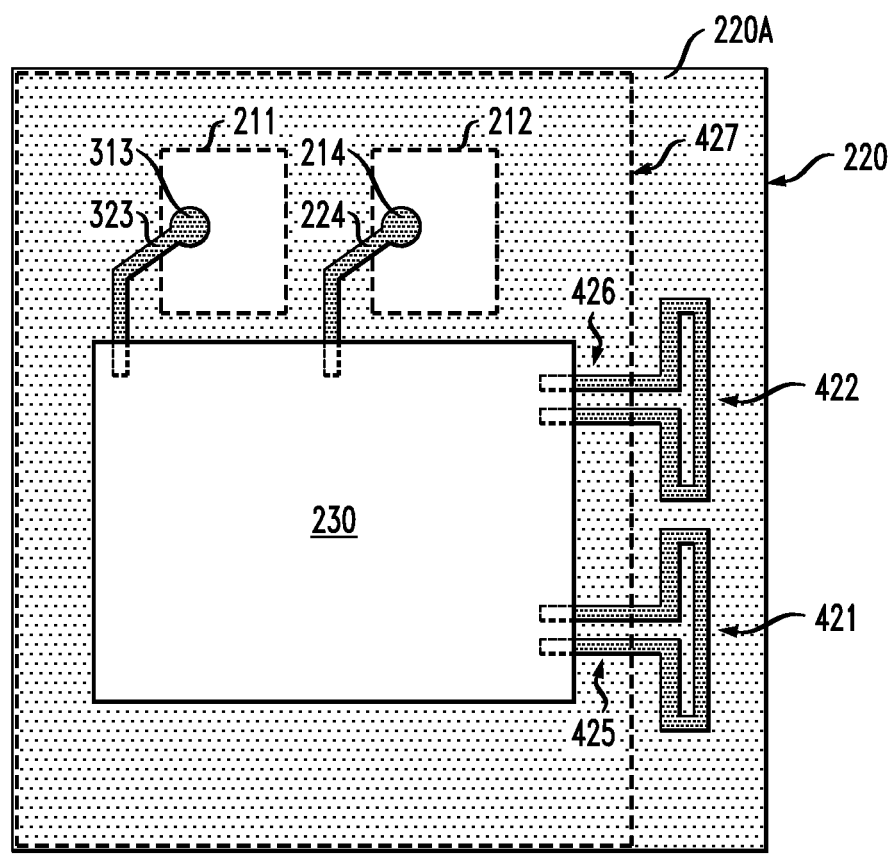
FIG. 4 schematically depicts an antenna package according to another embodiment of the invention.

FIG. 4 schematically depicts an antenna package 400 according to another embodiment of the invention. The antenna package 400 shown in FIG. 4 is similar to the antenna package 300 discussed above with reference to FIGS. 3A and 3B, except that the antenna package 400 comprises a first folded dipole antenna 421 and a second folded dipole antenna 422 to provide end-fire radiation. Moreover, a first differential feed line 425 is formed on the surface 220A of the second substrate 220 to feed the first folded dipole antenna 421, and a second differential feed line 426 is formed on the surface 220A of the second substrate 220 to feed the second folded dipole antenna 422. Furthermore, a ground plane 427 (shown in dashed outline form) on the opposing surface of the second substrate 220 does not extend under the first and second folded dipole antennas 421 and 422.

In another embodiment of the invention, the first and second folded dipole antennas 421 and 422 can be replaced with regular dipole antennas. However, a folded dipole antenna provides wider bandwidth and better impedance matching than regular dipole antenna. Indeed, since a differential feed line with high impedance is typically used to feed a dipole or a folded dipole antenna, it is not possible to match the impedance of a dipole antenna to the impedance of the differential feed line without using other impedance matching circuit structures.

Figure 5:
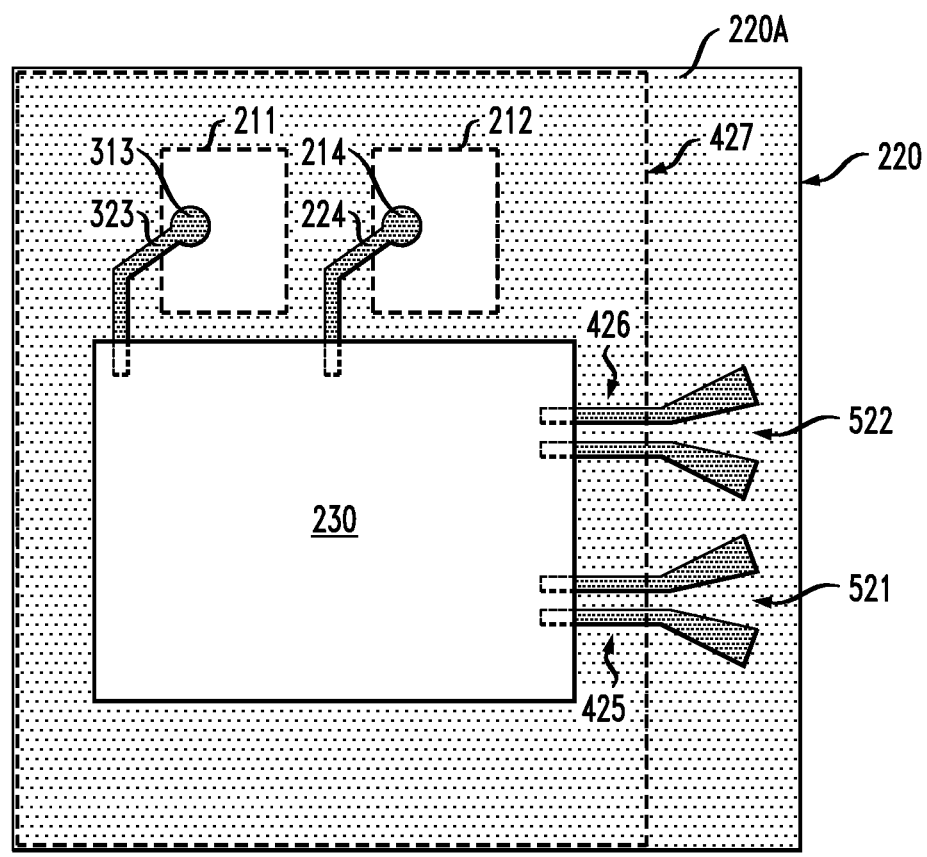
FIG. 5 schematically depicts an antenna package according to another embodiment of the invention.

FIG. 5 schematically depicts an antenna package 500 according to another embodiment of the invention. The antenna package 500 shown in FIG. 5 is similar to the antenna package 400 discussed above with reference to FIG. 4, except that the antenna package 500 comprises a first Vivaldi antenna 521 and a second Vivaldi antenna 522 to provide end-fire radiation. The planar Vivaldi antenna structure provides very wide bandwidth, which is desired for certain applications.

Figure 6A:
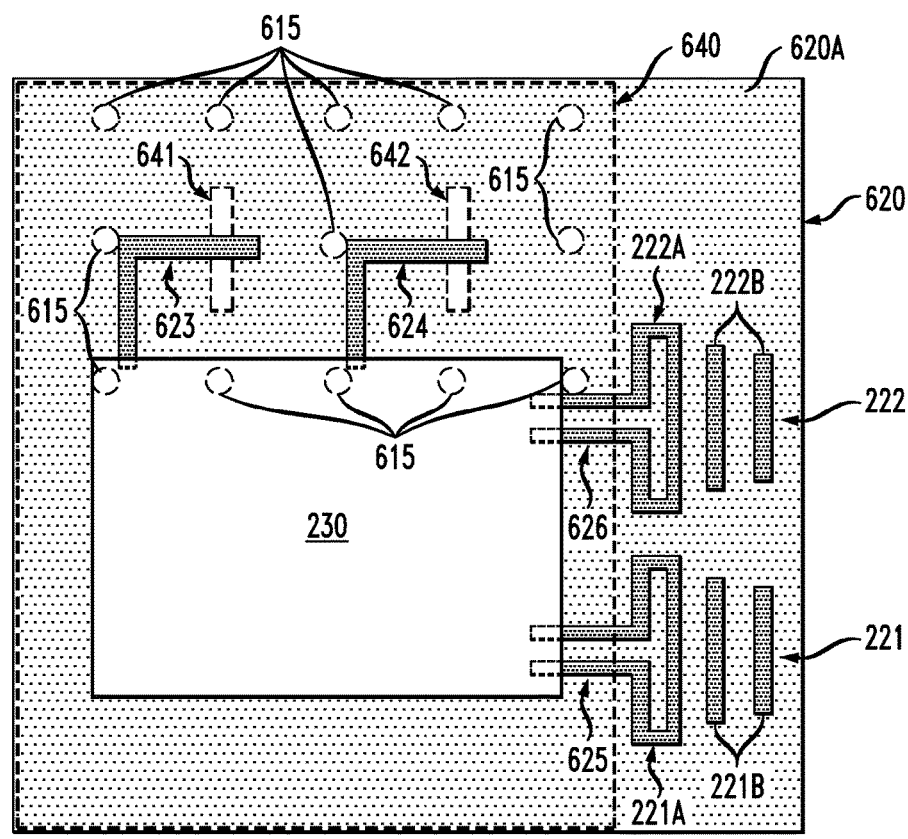
FIGS. 6A and 6B schematically depict an antenna package according to another embodiment of the invention.
Figure 6B:
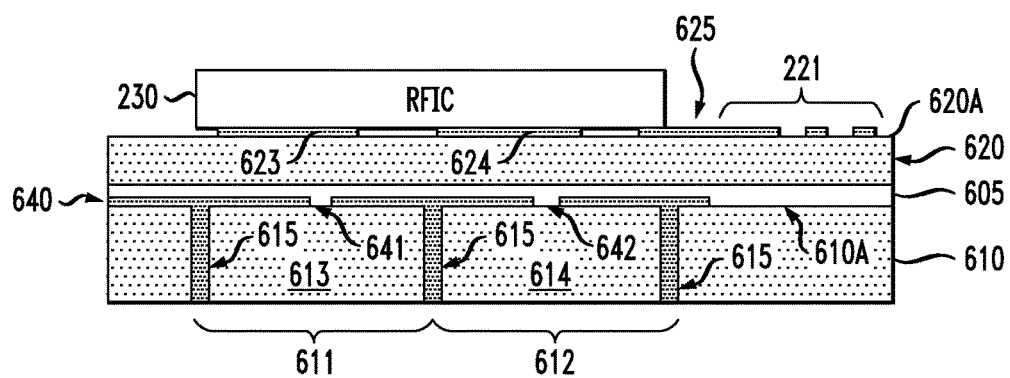

FIGS. 6A and 6B schematically depict an antenna package 600 according to another embodiment of the invention, wherein FIG. 6A is a schematic top view of the antenna package 600, and FIG. 6B is a schematic side view of the antenna package 600. In general, similar to previously discussed embodiments, the antenna package 600 comprises a first substrate 610, a second substrate 620, and an RFIC chip 230 that is flip-chip mounted to a first surface 620A of the second substrate 620. The first substrate 610 and second substrate 620 are bonded together using an adhesive layer 605.

Moreover, similar to the embodiment discussed above in FIGS. 2A/2B, the second substrate 620 comprises a first Yagi antenna 221 and a second Yagi antenna 222 formed on the first surface 620A thereof, each comprising a respective driven element 221A and 222A (e.g., folded dipole element) and respective parasitic elements 221B and 222B (e.g. director elements). A ground plane 640 serves as a reflector element for the first and second Yagi antennas 221 and 222. The ground plane 640 is formed on a surface 610A of the first substrate 610, which is bonded to the second substrate 620. The perimeter of the ground plane 640 is depicted in FIG. 6A as a dashed line. The first and second Yagi antennas 221 and 222 are fed by first and second differential feed lines 625 and 626 formed on the first surface 620A of the second substrate 620. As in previously discussed embodiments, the first and second Yagi antennas 221 and 222 are used for end-fire radiation.

The first substrate 610 comprises a first aperture-coupled cavity antenna 611 and a second aperture-coupled cavity antenna 612 formed within the first substrate 610, which are used for broadside radiation. The first and second aperture-coupled cavity antennas 611 and 612 are formed by respective portions of dielectric material 613 and 614 of the first substrate 610 surrounded by metallic sidewalls and bottom walls of the antennas 611 and 612. In particular, the metallic sidewalls of the first and second aperture-coupled cavity antennas 611 and 612 are defined by a series of metalized via holes 615 which form rectangular via cages (as specifically shown in FIG. 6A) surrounding the respective portions of dielectric material 613 and 614. The metallic bottom walls of the first and second aperture-coupled cavity antennas 611 and 612 are defined by portions of the ground plane 640 within the perimeter of the respective via cages. The metalized via holes 615 that define the antenna sidewalls are spaced apart (pitch) at a distance that is less than one quarter wavelength of the desired operating frequency.

The ground plane 640 comprises a first aperture 641 and a second aperture 642, which serve as coupling slots to couple electromagnetic energy to and from the respective first and second aperture-coupled cavity antennas 611 and 612 from respective first and second antenna feed lines 623 and 624. The first and second antenna feed lines 623 and 624 transmit RF energy between the RFIC chip 230 and the first and second aperture-coupled cavity antennas 611 and 612. In one embodiment, the first and second antenna feed lines 623 and 624 are L-shaped strip lines that utilize the ground plane 640 as the transmission line ground plane.

The first and second aperture-coupled cavity antennas 611 and 612 are also referred to as "filled-cavity" antennas. In general, the resonant frequencies of the first and second aperture-coupled cavity antennas 611 and 612 is a function of the length, width and depth of the antennas structures (as defined by the metalized via holes 615 and ground plane 640), as well as the dielectric constant of the portions of the dielectric material 613 and 614 forming the antennas 611 and 612. In typical designs, cavity antennas have a wider bandwidth than patch antennas. In other embodiment, the broadside antenna radiators may be aperture-coupled patch antennas that replace the first and second aperture-coupled cavity antennas 611 and 612 in the antenna package 600.

Figure 7A:
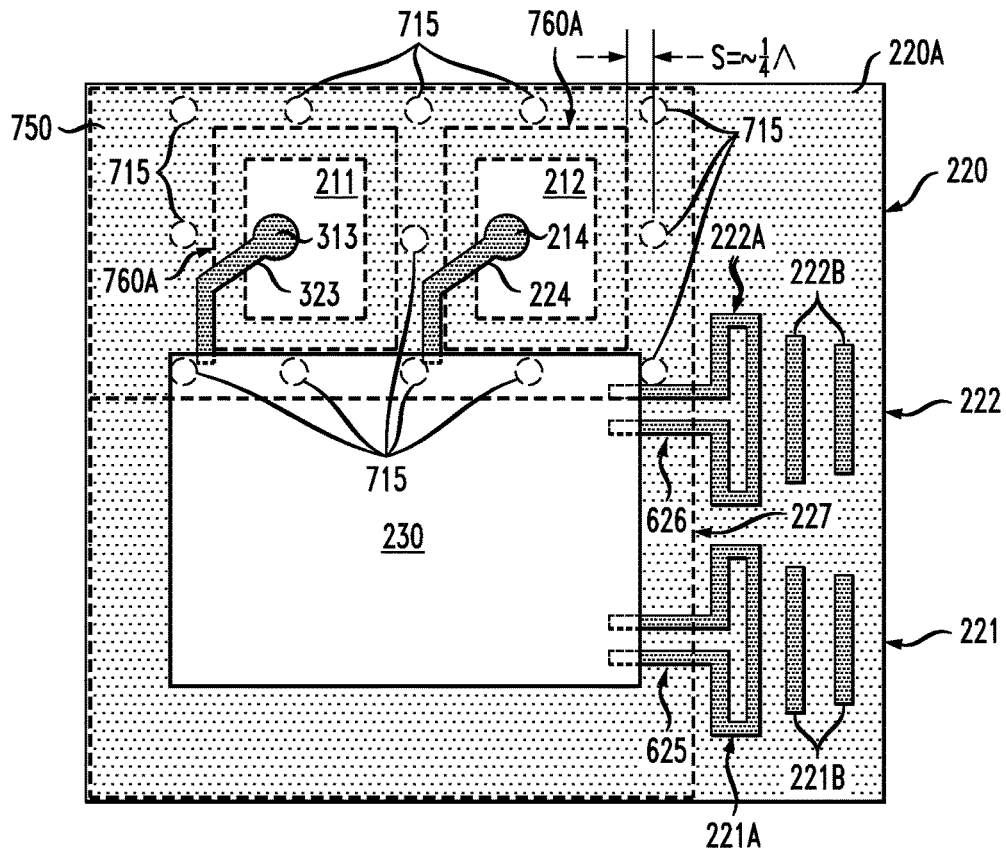
FIGS. 7A and 7B schematically depict an antenna package according to another embodiment of the invention.
Figure 7B:
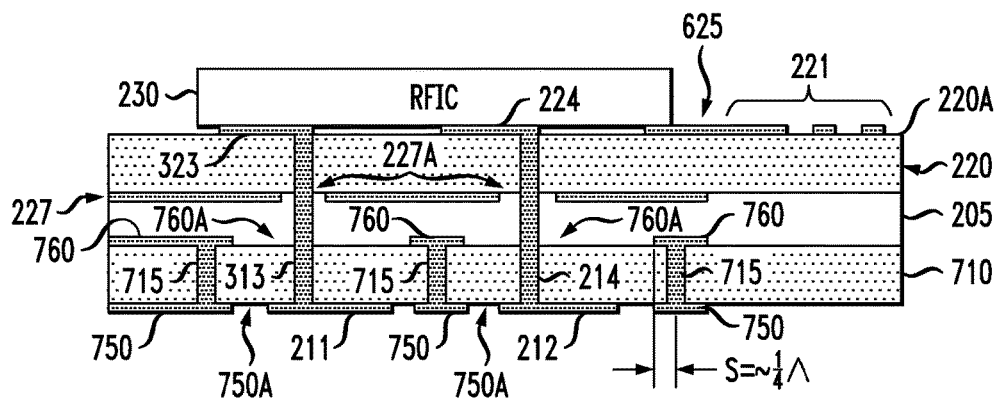

FIGS. 7A and 7B schematically depict an antenna package 700 according to another embodiment of the invention, wherein FIG. 7A is a schematic top view of the antenna package 700, and FIG. 7B is a schematic side view of the antenna package 700. In general, the antenna package 700 shown in FIGS. 7A and 7B has the same or similar components as shown in the antenna packages 200, 300 and 600 as discussed above, so a detailed discussion thereof will not be repeated. The antenna package 700 differs from the above embodiments in that the antenna package 700 comprises a first substrate 710 having metalized via holes 715, a patterned metallic top plane 750, and a patterned metallic backplane 760. The patterned metallic top plane 750 comprises etched regions 750A that electrically isolate the first and second patch antennas 211 and 212 from the metallic top plane 750. Moreover, the patterned metallic backplane 760 comprises etched regions 760A that are aligned with the first and second patch antennas 211 and 212 to expose the antenna ground plane 227.

The antenna package 700 is designed to suppress or eliminate the creation of surface waves, which is a common problem for patch antennas, especially in package structures. Surface waves not only reduce antenna efficiency and adversely affect antenna performance, but also cause antenna-in-package reliability issues, such as reduced performance depending on the location on an application board. In this regard, the metalized via holes 715, the metallic top plane 750, and the metallic backplane 760 form isolating cavities for the first and second patch antennas 211 and 212. In particular, as more specifically shown in FIG. 7A, the metalized via holes 715 essentially provide metallic cavity walls that form rectangular via cages which surround the first and second patch antennas 211 and 212. The metalized via holes 715 electrically connect the metallic top and back planes 750 and 760, thereby forming cavities that suppress or eliminate surface waves. For effective surface wave suppression, the spacing S (as shown in FIGS. 7A and 7B) between the metalized via holes 715 and the edges of the etched regions 750A and 760A of the metallic top and back planes 750 and 760 should be approximately ¼ wavelength of the operating frequency. In this embodiment, the metallic backplane 760 and the ground plane 227 are not physically connected in DC, but they are virtually connected at 60 GHz frequencies due to a large capacitance between the two planes 760 and 227.

Figure 8A:
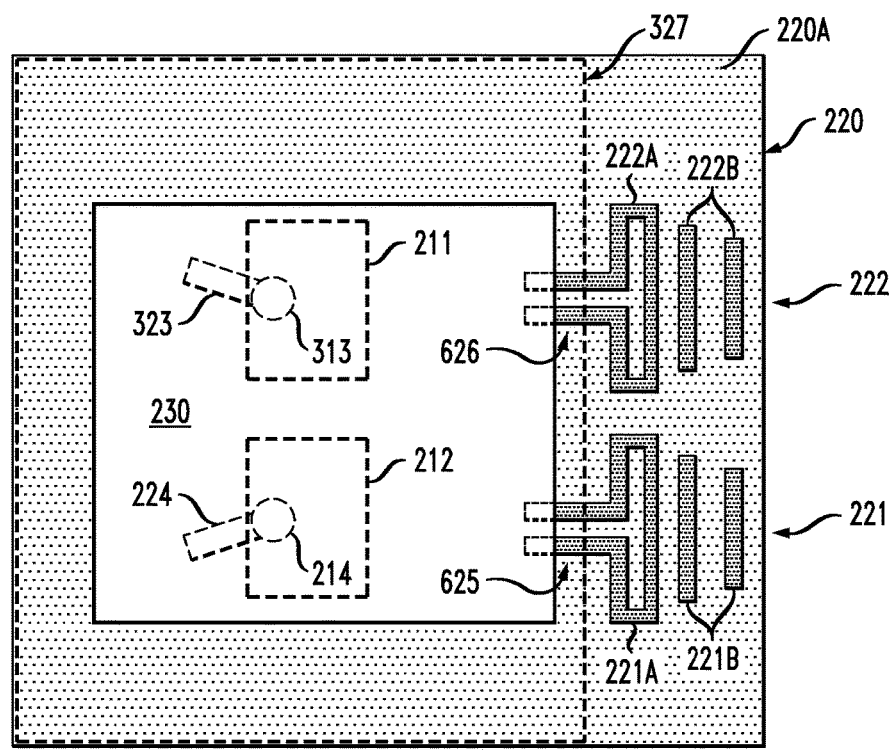
FIGS. 8A and 8B schematically depict an antenna package according to another embodiment of the invention.
Figure 8B:
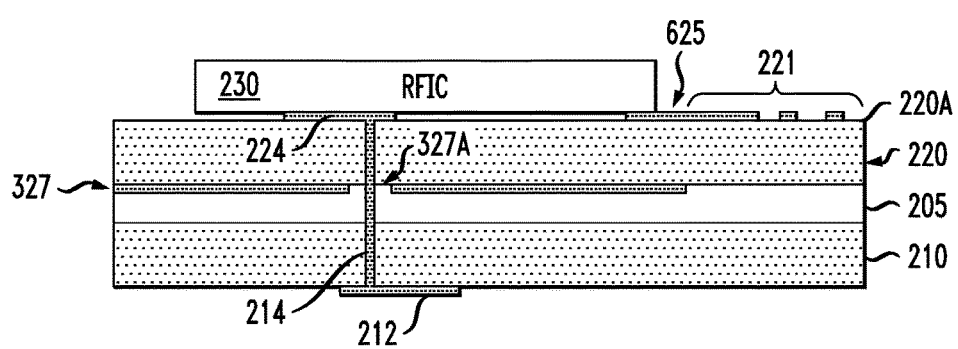

FIGS. 8A and 8B schematically depict an antenna package 800 according to another embodiment of the invention, wherein FIG. 8A is a schematic top view of the antenna package 800, and FIG. 8B is a schematic side view of the antenna package 800. In general, the antenna package 800 shown in FIGS. 8A and 8B has the same or similar components as shown in the antenna package embodiments as discussed above, so a detailed discussion thereof will not be repeated. The antenna package 800 differs from the above embodiments in that the first and second patch antennas 211 and 212 (broadside radiating antennas) are vertically disposed below RFIC chip 230, as compared to the antenna package 200, 300, 400, and 500, for example, wherein the first and second patch antennas 211 and 212 are vertically disposed away (i.e., offset) from edge of the RFIC chip 230. In this regard, the antenna package 800 can provide a more compact structure.

Figure 9:
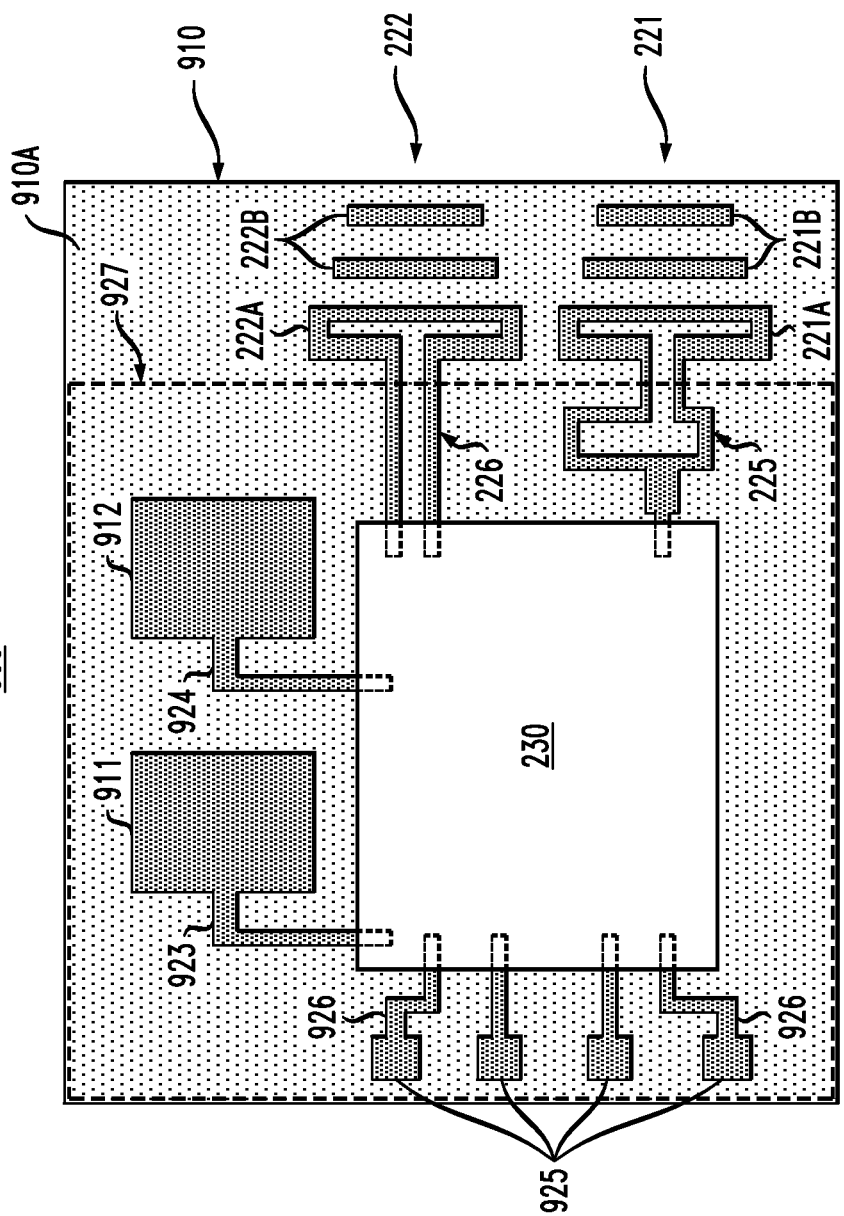
FIG. 9 schematically depicts an antenna package according to another embodiment of the invention.

FIG. 9 schematically depicts an antenna package 900 according to another embodiment of the invention. In particular, FIG. 9 is a schematic top view of an antenna package 900 comprising a single substrate 910 having various planar components patterned on a first surface 910A thereof, and a ground plane 927 formed on an opposing surface thereof (wherein the perimeter of the ground plane 927 is depicted as a dashed outline). Similar to the antenna package 200 shown in FIGS. 2A/2B, the antenna package 900 includes first and second Yagi antennas 221 and 222 and associated antenna feed lines 225 and 226, to receive and transmit end-fire radiation.

In addition, to receive or transmit broadside radiation, the antenna package 900 comprises first and second edge-fed patch antennas 911 and 912, and associated antenna feed lines 923 and 924, formed on the first surface 910A of the single substrate 910. In addition, the antenna package 900 comprises a plurality of BGA pads 925 and associated feed connections 926 to connect to the RFIC chip 230. In this embodiment, the antenna package 900 would be mounted to an application board via BGA connections to the BGA pads 925, with the portion of the first surface 910A having the antennas. 911, 912, 221 and 22 extended past edges of the application board. If the requirement of the antenna package size is not critical or no more than four antennas are required, the single substrate antenna package 900 design of FIG. 9 can be used.

Figure 10:
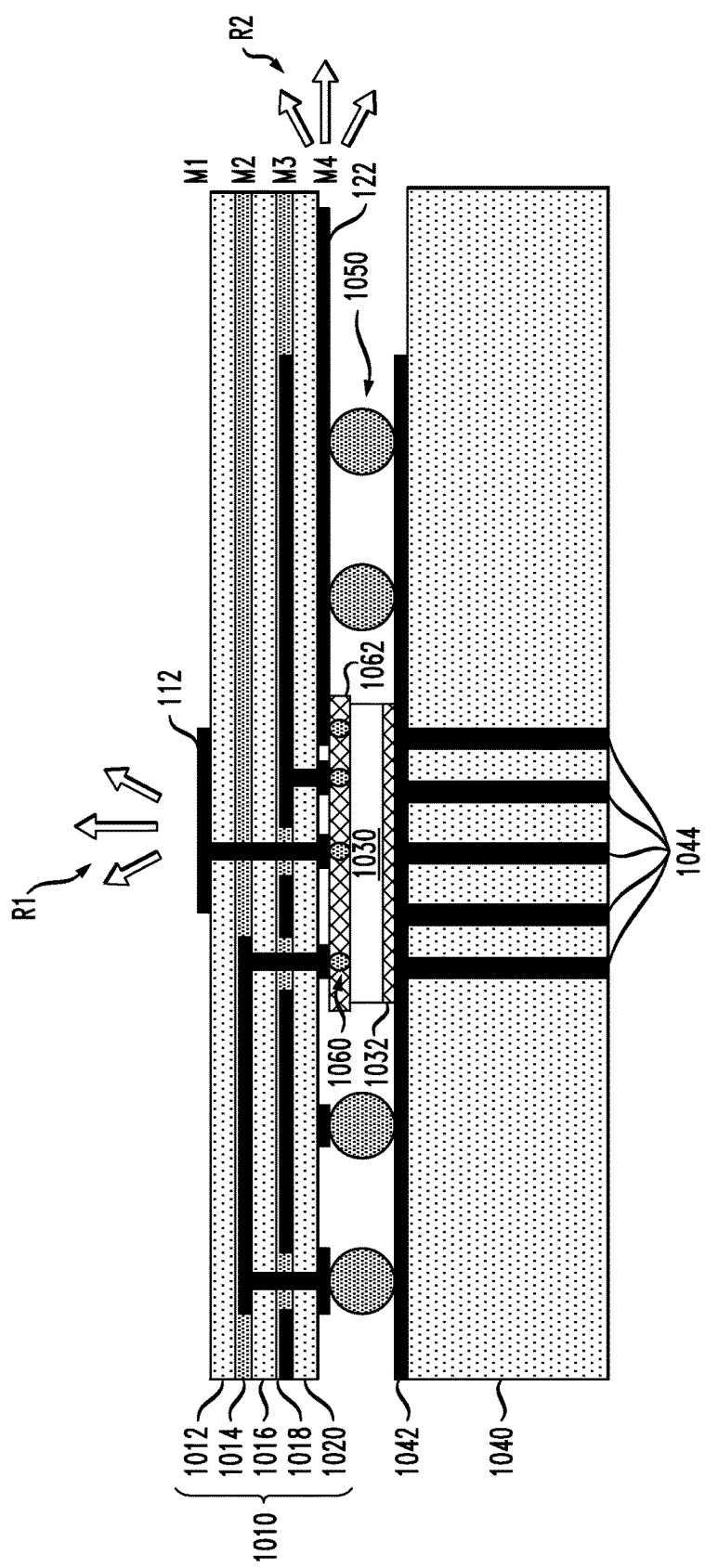
FIG. 10 schematically depicts a wireless communications package structure according to another embodiment of the invention.

FIG. 10 schematically depicts a wireless communications package 1000 according another embodiment of the invention. In general, the wireless communications package 1000 comprises an antenna-in-package 1010 (or "antenna package"), an RFIC chip 1030, and an application board 1040. The antenna package 1010 comprises a first substrate 1012, a first adhesive layer 1014, a second substrate 1016, a second adhesive layer 1018, and a third substrate 1020. A first metallization layer M1 is formed on one surface of the first substrate 1012. A second metallization layer M2 is formed on a surface of the second substrate 1016. A third metallization layer M3 is formed on one surface of the third substrate 1020, and a fourth metallization layer is formed on another surface of the third substrate 1020.

As further shown in FIG. 10, the application board 1040 comprises a metallization layer 1042 formed on one surface thereof, and a plurality of metallic thermal vias 1044 that are formed through the application board 1040. A layer of thermal interface material 1032 is utilized to thermally couple the non-active (backside) surface of the RFIC chip 1030 to a region of the application board that is aligned to the plurality of metallic thermal vias 1044. The layer of thermal interface material 1032 serves to transfer heat to the thermal vias 1044, wherein the thermal vias 1044 serve as a heat sink (or a portion thereof) to dissipate heat that is generated by the RFIC chip 1030.

The antenna package 1010 is electrically and mechanically connected to the application board 1040 using an array of BGA connections 1050 (or other similar techniques). The BGA connections 1050 are formed between corresponding contact pads and wiring patterns of the fourth metallization layer M4 on the third substrate 1020, and contact pads and wiring patterns of the metallization layer 1042 on the application board 1040.

The RFIC chip 1030 comprises a metallization pattern on an active (front side) surface thereof, which includes, for example, ground pads, DC power supply pads, input/output pads, control signal pads, associated wiring, etc., that are formed as part of a BEOL (back end of line) wiring structure of the RFIC chip 1030. The RFIC chip 1030 is electrically and mechanically connected to the antenna package 1010 by flip-chip mounting the front-side contacts of the RFIC chip 1030 to corresponding contact pads of the metallization layer M4 on the third substrate 1020 of the antenna package 1010 using an array of solder ball controlled collapse chip connections (C4) 1060, or other known techniques. An under fill material 1062 is used to strengthen the C4 connections 1060, and optionally the BGA connections 1050.

The embodiment of the wireless communications package 1000 of FIG. 10 is similar to the embodiment of the wireless communication package 10 of FIG. 1 in that the antenna package 1010 of FIG. 10 generically illustrates antenna structures 112 and 122 (and associated feed lines) transmitting and/or receiving broadside radiation R1 and end-fire radiation R2, respectively. Moreover, the RFIC chip 1030 comprises RFIC circuitry and electronic components formed on the active side including, for example, a receiver, a transmitter or a transceiver circuit, and other active or passive circuit elements that are commonly used to implement wireless RFIC chips.

While the embodiment of FIG. 1 shows the antenna package 100 mounted to the application board 140 so that an edge region of the antenna package 100 (in which the end-fire radiating antenna 122 is disposed) extends at some distance, d, past an edge of the application board 140, the embodiment of FIG. 10 shows that the antenna package 1010 is mounted to the application board 1040 with no extended end portion. In this embodiment, the antenna package 1010 can be fabricated with materials and structural configurations (as will be discussed below with reference to FIGS. 11 and 15, for example) which are effective to eliminate or otherwise significantly reduce any adverse effects that other structures and components of the wireless communications package 1000 may have on the radiation properties (e.g., efficiency, directivity, etc.) of the end-fire radiating antenna 122. Similar to the embodiment of FIG. 1, the wireless communications package 1000 can support 60 GHz antenna-in-package solutions, for example, for either single antenna or phased-array applications for portable application such as electronic tablets and smart phones, wherein for portable applications, the combination of broadside and end-fire radiation improves wireless performance and reduces specific absorption rate (SAR), an important health concern, especially with switchable antenna beams.

Figure 11:
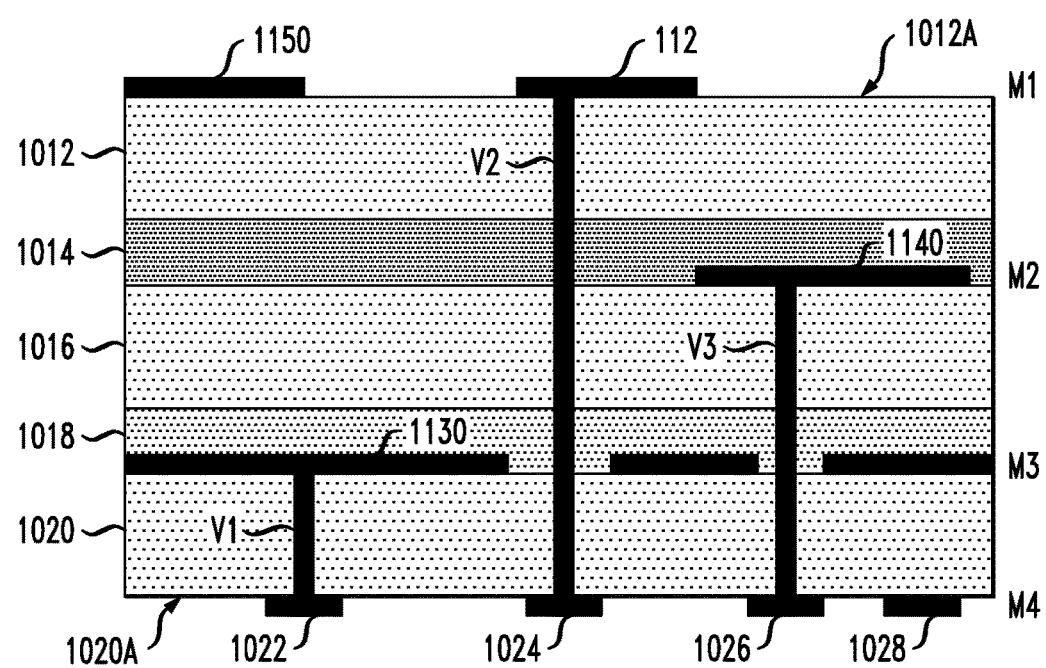
FIG. 11 schematically depicts a stack structure of an antenna package according to an embodiment of the invention, which can be implemented in the wireless communications package structure of FIG. 10.

FIG. 11 schematically depicts an antenna package according to an embodiment of the invention, which can be implemented in the wireless communications package 1000 of FIG. 10. More specifically, FIG. 11 is a cross-sectional schematic view of a portion of an antenna package 1110 having a stack of layers similar to the antenna package 1010 of FIG. 10. In particular, the antenna package 1110 comprises a first substrate 1012, a first adhesive layer 1014, a second substrate 1016, a second adhesive layer 1018, and a third substrate 1020. In addition, the antenna package 1110 comprises a first metallization layer M1 formed on a surface 1012A of the first substrate 1012, a second metallization layer M2 formed on a surface of the second substrate 1016, a third metallization layer M3 formed on one surface of the third substrate 1020, and a fourth metallization layer M4 formed on another surface 1020A of the third substrate 1020.

In one embodiment of the invention, the first metallization layer M1 comprises one or more planar antenna structures (e.g., patch antenna 112) to receive or transmit signals in the broadside direction, as well as one or more ungrounded parasitic elements 1150 that are configured to improve broadside antenna radiation characteristics by eliminating or reducing the surface waves on the surface 1012A of the first substrate 1012. Various alternative embodiments of antenna packages comprising ungrounded parasitic elements will be discussed below in further detail with reference to FIGS. 12, 13, and 14, for example.

Furthermore, in one embodiment of the invention, the second metallization layer M2 comprises a power plane 1140 that is configured to distribute DC power to the RFIC chip 1030 from the application board 1040. More specifically, in one embodiment of the invention, the second metallization layer M2 is a dedicated or special purpose metallic layer that comprises relatively large metallic power supply patches (as opposed to thin power supply lines or traces) to distribute DC power through the antenna package 1110 from the application board 1040 to the RFIC chip 1030. The use of relatively large power supply patches (as opposed to thin power supply lines or traces) provides for a low loss distribution of DC power, e.g., low resistive loss as well as reducing or eliminating loss through inductance that may otherwise occur using a DC power distribution network of narrow power supply lines or traces.

Moreover, in one embodiment of the invention, the third metallization layer M3 comprises a ground plane 1130 that serves multiple purposes. For example, the ground plane 1130 is configured to provide a ground plane for the planar antennas (e.g., patch antenna 112) formed on the first substrate 1012. The ground plane 1130 is also configured to provide a ground connection between ground pads on the application board 1040 and ground terminals of circuitry on the RFIC chip 1030. Moreover, the ground plane 1130 serves as a ground shield to isolate the RFIC chip 1030 from RF energy that is transmitted/received by the broadside antenna(s) 112. Moreover, the ground plane 1130 serves as a ground for the planar transmission lines (e.g. microstrip lines) that are formed on the surface 1020A of the third substrate 1020 to provide antenna feed lines for the broadside and end fire antenna(s).

As further shown in FIG. 11, the fourth metallization layer M4 comprises a plurality of contact pads 1022, 1024, 1026 and 1028, which serve to electrically and mechanically connect the antenna package 1110 to the RFIC chip 1030 and the application board 1040 as discussed above (FIG. 10). For example, the contact pad 1022 is a ground contact that is connected to the ground plane 1130 using a metalized via hole V1 that is formed through the third substrate 1020. The contact pad 1024 is an antenna feed line contact that is connected to the planar antenna 112 using a metalized via hole V2 that is formed through the layers 1012, 1014, 1016, 1018, and 1020. In this embodiment, the metalized via hole V2 comprises a portion of an antenna feed line. The contact pad 1026 is a power supply contact that is connected to the power plane 1140 using a metalized via hole V3 that is formed through the layers 1016, 1018, and 1020. The contact pad 1028 may be a non-electrical contact that merely serves to bond the antenna package 1110 to the RFIC chip 1030 or the application board 1040.

In one embodiment of the invention, the first, second and third substrates 1012, 1016, and 1020 can be formed of standard FR4 material with copper metallization, or other suitable materials commonly used to construct a standard PCB (printed circuit board), or other substrate materials that may be otherwise selected to achieve a desired or optimal performance for the target operating frequency. For example, in one embodiment of the invention, the first, second and third substrates 1012, 1016, and 1020 can be implemented using commercially available high-performance hydrocarbon ceramic laminates having mechanical and electrical properties that are optimal for high frequency applications (e.g., 60 GHz or higher).

By way of specific example, the first, second and third substrates 1012, 1016, and 1020 can be implemented using the RO4000® series of hydrocarbon ceramic laminates manufactured by Rogers Corporation. The hydrocarbon ceramic laminates are formed of low loss dielectric material that can be used in high operating frequency applications in which conventional circuit board laminates cannot be effectively used. Moreover, these commercially available hydrocarbon ceramic laminates can be easily fabricated into printed circuit boards using standard FR-4 circuit board processing techniques, thereby providing a low cost solution for constructing high performance antennal packages (as opposed to using more expensive laminate materials and processes such as PTFE-based laminates for high-frequency applications). The RO4000® series of hydrocarbon ceramic laminates are formed of a rigid, thermoset laminate material that has a thermal coefficient of expansion similar to that of copper, which provides good dimensional stability, and which provides reliable plated through-hole quality.

In one embodiment of the invention, for a 60 GHz application, each of the first, second and third substrates 1012, 1016, and 1020 can be fabricated using a hydrocarbon ceramic laminate with a thickness of about 4 mils (or less for higher operating frequencies). Moreover, the adhesive layers 1014 and 1018 can be formed of a thermoset epoxy prepreg adhesive material that is suitable for the given application. The adhesive layers 1014 and 1018 can have a thickness in a range of approximately 1-2 mils. The thickness of the various layers will vary depending on the operating frequency and other factors related to the type of planar antenna structures used. For example, for higher operating frequencies, the thickness of the layers 1012, 1014, 1016, 1018, and 1020 will decrease. Moreover, in the embodiment of FIG. 11, as the overall thickness of the antenna package 1110 decreases with higher operating frequencies, the power plane 1140 and ground plane 1130 metallization levels can be switched, wherein the ground plane 1130 is disposed between the power plane 1140 and the first metallization layer M1.

Figure 12:
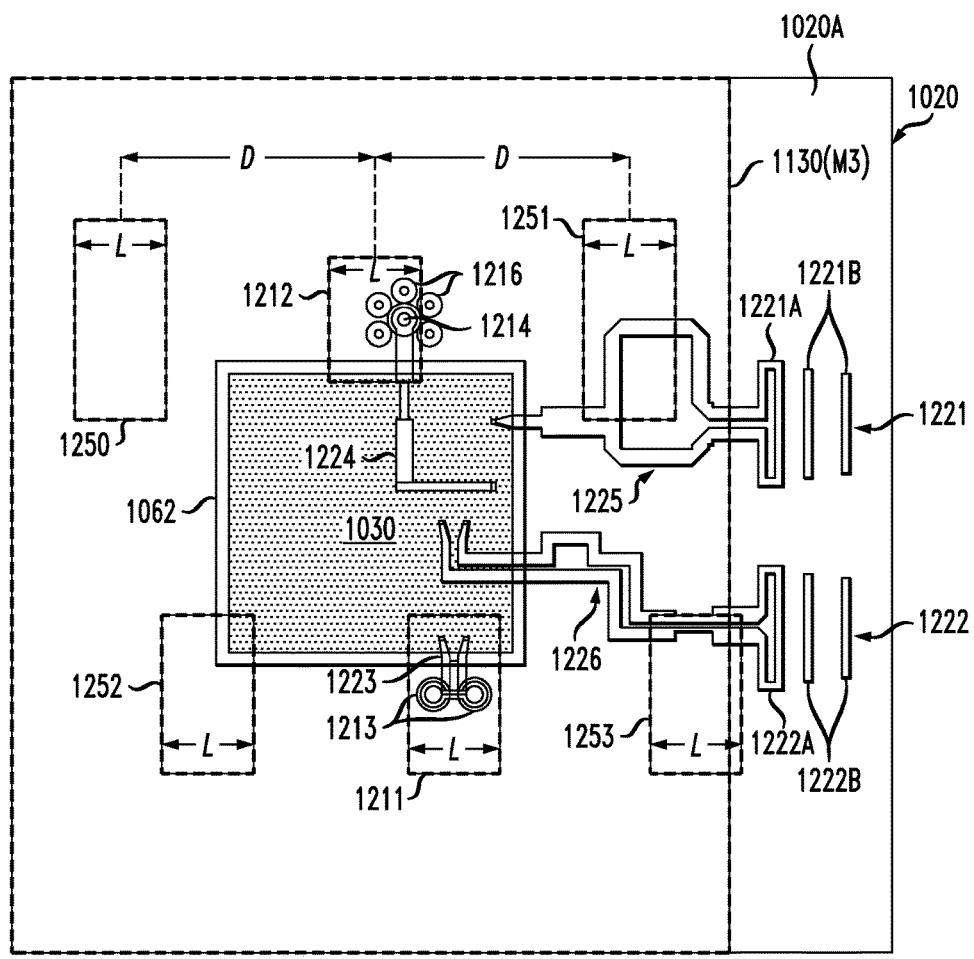
FIG. 12 schematically depicts an antenna package according to an embodiment of the invention in which ungrounded parasitic patch elements are utilized for reducing surface waves to enhance the broadside antenna radiation characteristics.

Although the unground parasitic element 1150 and antenna 112 are depicted generically in FIG. 11, these components can be implemented using various structures and antenna frameworks, as will be now be discussed in further detail with reference to FIGS. 12, 13 and 15. For example, FIG. 12 schematically depicts an antenna package according to an embodiment of the invention in which ungrounded parasitic patch elements are utilized for reducing surface waves to enhance the broadside antenna radiation characteristics. More specifically, FIG. 12 is a schematic plan view of an antenna package 1200 comprising a stack of layers (e.g., layer 1012, 1014, 1016, 1018, and 1020) similar to the embodiment of FIG. 11, wherein the RFIC chip 1030 is shown (in phantom) as being flip chip mounted to the bottom surface 1020A of the third substrate 1020.

The first substrate 1012 comprises a first patch antenna 1211 and a second patch antenna 1212 formed on the upper surface 1012A thereof. In addition, a plurality of ungrounded parasitic patch elements 1250, 1251, 1252, and 1253 are formed on the upper surface 1012A of the first substrate 1012. Moreover, similar to the embodiment shown in FIG. 2A, the third substrate 1020 comprises a first Yagi antenna 1221 and a second Yagi antenna 1222 formed on the bottom surface 1020A thereof. The first and second Yagi antennas 1221 and 1222 each comprise a respective driven element 1221A and 1222A (e.g., folded dipole element) and respective parasitic elements 1221B and 1222B (e.g. director elements).

The antenna package 1200 further comprises a plurality of feed lines that connect the RFIC chip 1030 to the antennas 1211, 1212, 1221, and 1222. In particular, a first antenna feed line 1213/1223 feeds the first patch antenna 1211, a second antenna feed line 1214/1224 feeds the second patch antenna 1212, a third antenna feed line 1225 feeds the first Yagi antenna 1221, and a fourth antenna feed line 1226 feeds the second Yagi antenna 1222. The outer boundary of the ground plane 1130 (and application board metallization 1042 (see FIG. 10)) is depicted in FIG. 12 as a dashed rectangle.

As noted above, in many 60 GHz applications, for example, transmitting antennas use differential feed lines, while receiving antennas use single-ended feed lines. In this regard, in one embodiment of the invention, the first patch antenna 1211 operates as a transmitting antenna in the broadside direction, which is fed by a differential antenna feed line, while the second patch antenna 1212 operates as a receiving antenna in the broadside direction, which is fed by a single-ended antenna feed line. In particular, the first antenna feed line 1213/1223 comprises differential vertical vias 1213 (e.g., plated via holes), and a planar differential line 1223. The differential vertical vias 1213 are connected to the first patch antenna 1211 and extend through the stack of layers 1012, 1014, 1016, 1018, and 1020. The planar differential line 1223 is formed on the bottom surface 1020A of the third substrate 1020 and is connected to the RFIC chip 1030.

The second antenna feed line 1214/1224 comprises a single vertical via 1214, and a single-ended antenna feed line 1224. The single vertical via 1214 is connected to the second patch antenna 1212 and extends through the stack of layers 1012, 1014, 1016, 1018, and 1020. The single-ended antenna feed line 1224 is formed on the bottom surface 1020A of the third substrate 1020 and is connected to the RFIC chip 1030. In other embodiments of the invention, a patch antenna (with a single-ended feed point) can be differentially fed by using a BALUN to transform the single-ended feed point to a differential feed, and thereby provide a differentially fed patch antenna having only one feed point attached to the patch antenna.

In another embodiment of the invention, as shown in FIG. 12, a circular arrangement of shielding vias 1216 can be formed around the single vertical via 1214 to provide RF shielding. More specifically, the circular arrangement of shielding vias 1216 can be formed in the third substrate 1020 surrounding the portion of the vertical via 1214 that extends through the third substrate 1020, and connected to the ground plane 1130. The circular arrangement of shielding vias 1216 can optionally be utilized, when necessary, to provide coaxial shielding of the vertical via 1124 from low frequency connections on the bottom surface 1020A of the third substrate and the RFIC chip 1030.

Furthermore, in one embodiment of the invention, the first Yagi antenna 1221 operates as a receiving antenna in the end-fire direction, which is fed by a single-ended antenna feed line, while the second Yagi antenna 1222 operates as a transmitting antenna in the end-fire direction, which is fed by a differential antenna feed line. In particular, the third antenna feed line 1225 comprises a BALUN that is formed on the bottom surface 1020A of the third substrate 1020 connecting the first Yagi antenna 1221 to the RFIC chip 1030, wherein the BALUN transforms the natural differential input of the first Yagi antenna 1221 to a single-ended feed. Moreover, the fourth antenna feed line 1226 is a planar balanced differential feed line that is formed on the bottom surface 1020A of the third substrate 1020 connecting the second Yagi antenna 1222 to the RFIC chip 1030.

In one embodiment of the invention, the differential vertical vias 1213 and the single vertical via 1214 of the antenna feed lines (and optional shielding vias 1216) are copper-plated through holes that are formed through the stack of layers 1012, 1014, 1016, 1018, and 1020. The ground plane 1130 (M3 metallization layer) operates as an antenna ground plane for the first and second patch antennas 1211 and 1212, and serves as a ground plane for the planar antenna feed lines 1223, 1224, 1225 and 1226 that are formed on the bottom surface 1020A of the third substrate 1020, and further serves as the reflector element of the first and second Yagi antennas 1221 and 1222.

In the embodiment of FIG. 12, the ungrounded parasitic patch elements 1250, 1251, 1252, and 1253 formed on the upper surface 1012A of the first substrate 1012 are configured to improve the broadside radiation characteristics of the patch antennas 1211 and 1212 by reducing surface waves. More specifically, FIG. 12 illustrates that the patch antennas 1211 and 1212 are rectangular-shaped patches having a length L (between critical edges), wherein the center frequency of operation of each patch antenna 1211 and 1212 is determined by its length L. As is known in the art, a microstrip patch antenna will have a length L that is equal to one-half of a wavelength within the dielectric (substrate) medium. The width of the rectangular shaped patch antennas 1211 and 1212 can be varied to adjust the impedance of the patch antennas 1211 and 1212.

In the embodiment of FIG. 12, because of their rectangular shape (as opposed to a square shape), the patch antennas 1211 and 1212 are configured to radiate and capture signals that are linear-polarized in the left-right direction of the drawing. In this regard, the ungrounded parasitic patch elements 1250 and 1251 are disposed on either side of the patch antenna 1212 (adjacent the critical edges thereof which define the patch length L) to minimize or eliminate the dominant surface waves that flow along the surface 1012A of the first substrate 1012 in the left-right direction. Similarly, the ungrounded parasitic patch elements 1252 and 1253 are disposed on either side of the patch antenna 1211 (adjacent the critical edges thereof which define the patch length L) to minimize or eliminate the dominant surface waves that flow along the surface 1012A of the first substrate 1012 in the left-right direction.

In one embodiment, to reduce or eliminate the surface waves along the surface 1012A of the first substrate 1012 in the left-right direction, the ungrounded parasitic patch elements 1250 and 1251 are designed with a length L that is equal to one-half the wavelength within the dielectric (substrate) medium, and are separated from the patch antenna 1212 by a distance D. In one embodiment of the invention, the distance D is at least equal to, or greater than, one-half the free space wavelength. Similarly, the ungrounded parasitic patch elements 1252 and 1253 are designed with a length L that is equal to one-half the wavelength within the dielectric (substrate) medium, and are separated from the patch antenna 1211 by the distance D. By reducing or eliminating the surface waves, the ungrounded parasitic patch elements 1250, 1251, 1252 and 1253 serve to increase the radiation efficiency and enhance the radiation beam shape of the patch antennas 1211 and 1212 in the broadside direction.

As with the embodiment discussed above with reference to FIGS. 2A/2B, the first patch antenna 1211 and second Yagi antenna 1222 (transmitting antennas) can be independently operated to transmit radiation in only one of the broadside or end-fire directions, or in both directions at the same time. Moreover, the first patch antenna 1211 and second Yagi antenna 1222 can be operated as a two-element phased array antenna to steer the transmitting radiation beam in a given direction between the broadside and end-fire directions, using beam steering techniques well-known to those of ordinary skill in the art. In receiving mode, depending on the circuitry configuration of the RFIC chip 1030, the receiving antennas 1212 and 1221 can be selectively operated depending on whether the received signal is stronger in the broadside or end-fire direction.

Figure 13:
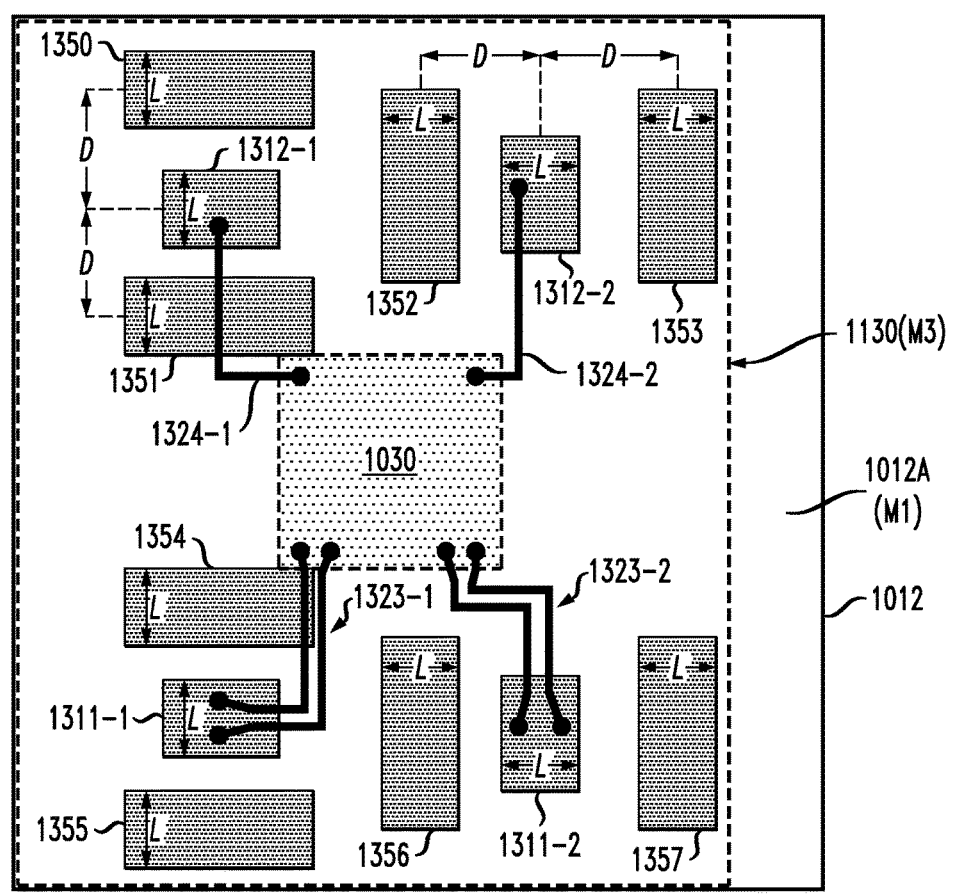
FIG. 13 schematically depicts an antenna package according to another embodiment of the invention in which multiple patch antennas are utilized to provide polarization diversity for receive and transmit modes of operation.

FIG. 13 schematically depicts an antenna package according to another embodiment of the invention in which multiple patch antennas are utilized to provide polarization diversity for receive and transmit modes of operation. More specifically, FIG. 13 is a schematic plan view of an antenna package 1300 which is similar to the antenna package 1200 of FIG. 12, except that the first substrate 1012 comprises four patch antennas 1311-1, 1311-2, 1312-1 and 1312-2, and corresponding ungrounded parasitic patch elements 1350, 1351, 1352, 1353, 1354, 1355, 1356 and 1357, which are all formed on the upper surface 1012A of the first substrate 1012. For ease of illustration, the end-fire antenna structures are not shown in FIG. 13.

In the embodiment of FIG. 13, the patch antennas 1312-1 and 1312-2 are "receive" patch antennas that are fed by respective single-ended antenna feed lines 1324-1 and 1324-2. The receive patch antennas 1312-1 and 1312-2 each have a length L equal to one-half the wavelength within the dielectric (substrate) medium. The receive patch antennas 1312-1 and 1312-2 are oriented orthogonally to each other to capture linear-polarized signal in different directions. In particular, the receive patch antenna 1312-1 is oriented to capture linear-polarized waves in the up-down direction of the drawing, while the receive patch antenna 1312-2 is oriented to capture linear-polarized waves in the left-right direction of the drawing. The ungrounded parasitic patch elements 1350 and 1351 are disposed adjacent to the critical edges of the receive patch antenna 1312-1 (which define its length L) to reduce or eliminate surface waves that are generated in the up-down direction of the drawing. The ungrounded parasitic patch elements 1352 and 1353 are disposed adjacent to the critical edges of the receive patch antenna 1312-2 (which define its length L) to reduce or eliminate surface waves that are generated in the left-right direction of the drawing.

Furthermore, the patch antennas 1311-1 and 1311-2 are "transmit" patch antennas that are fed by respective differential antenna feed lines 1323-1 and 1323-2. The transmit patch antennas 1311-1 and 1311-2 each have a length L equal to one-half the wavelength within the dielectric (substrate) medium. The transmit patch antennas 1311-1 and 1311-2 are oriented orthogonally to each other to transmit linear-polarized waves in different directions. In particular, the transmit patch antenna 1311-1 is oriented to transmit linear-polarized waves in the up-down direction of the drawing, while the transmit patch antenna 1311-2 is oriented to transmit linear-polarized waves in the left-right direction of the drawing. The ungrounded parasitic patch elements 1354 and 1355 are disposed adjacent to the critical edges of the transmit patch antenna 1311-1 (which define its length L) to reduce or eliminate surface waves that are generated in the up-down direction of the drawing. The ungrounded parasitic patch elements 1356 and 1357 are disposed adjacent to the critical edges of the transmit patch antenna 1311-2 (which define its length L) to reduce or eliminate surface waves that are generated in the left-right direction of the drawing.

Similar to the embodiment of FIG. 12 discussed above, the ungrounded parasitic patch elements 1350, 1351, 1352, 1352, 1354, 1355, 1356 and 1357 are designed with a length L that is equal to one-half the wavelength within the dielectric (substrate) medium, and are separated from the respective patch antennas 1311-1, 1311-2, 1312-1, and 1312-2 by a distance (pitch) D, wherein the distance D is at least equal to, or greater than, one-half the free space wavelength of the operating frequency.

The embodiment of FIG. 13 provides polarization diversity for receive and transmit modes of operation in the broadside direction. In one embodiment of the invention, for broadside transmission, one of the transmit patch antennas 1311-1 or 1311-2 can be selected to transmit a linear polarized wave in a desired direction. Moreover, for broadside reception, either one or both of the receive patch antennas 1312-1 and 1312-2 can be selected to receive signals in one or both linear-polarized directions.

Figure 14:
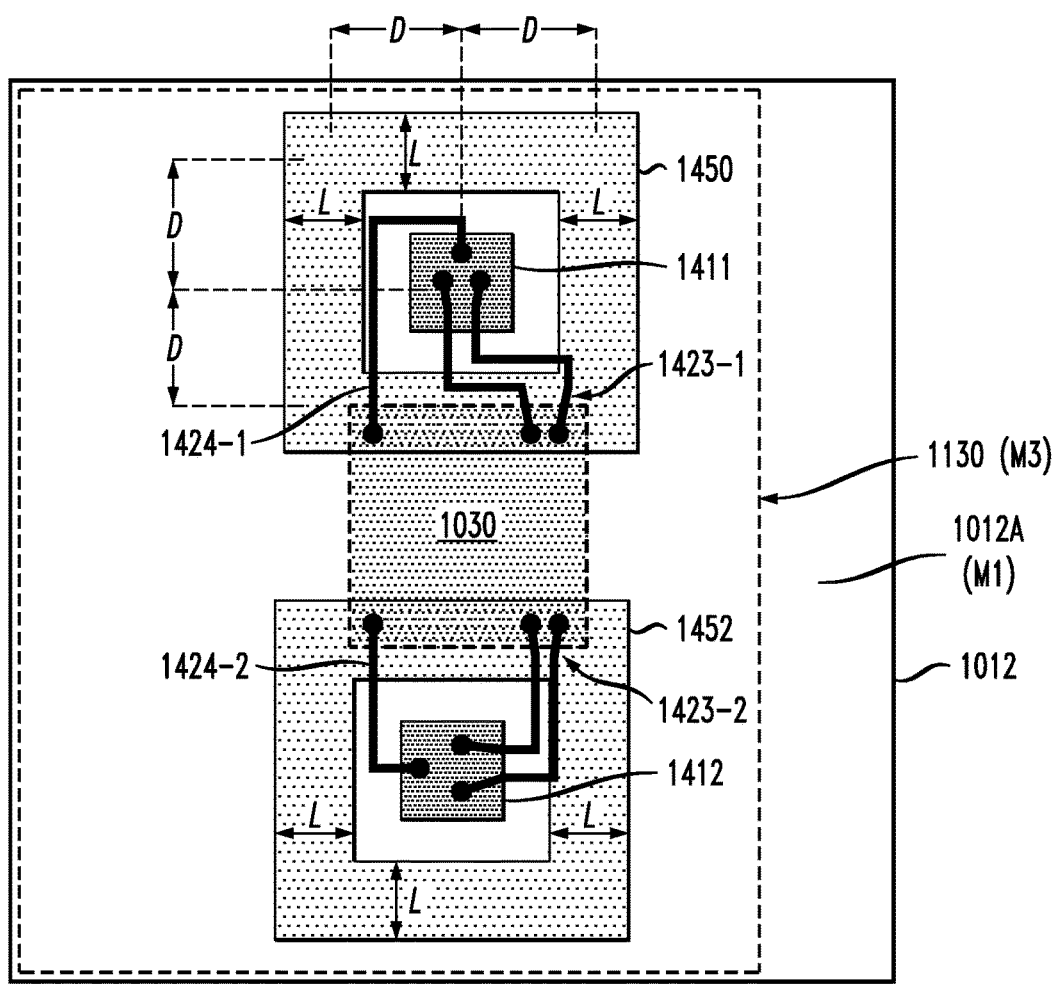
FIG. 14 schematically depicts an antenna package according to another embodiment of the invention in which multiple patch antennas are utilized to provide polarization diversity for receive and transmit modes of operation.

FIG. 14 schematically depicts an antenna package according to another embodiment of the invention in which multiple patch antennas are utilized to provide polarization diversity for receive and transmit modes of operation. More specifically, FIG. 14 is a schematic plan view of an antenna package 1400 which comprises a first patch antenna 1411, a second patch antenna 1412, a first ungrounded parasitic ring element 1450, and a second ungrounded parasitic ring element 1452, which are all disposed on the upper surface 1012A of the first substrate 1012. For ease of illustration, the end-fire antenna structures are not shown in FIG. 14.

In the embodiment of FIG. 14, the first and second patch antennas 1411 and 1412 are square-shaped patch antenna elements with equal length sides of length L, wherein L is equal to one-half the wavelength within the dielectric (substrate) medium. The first patch antenna 1411 is fed with a differential feed line 1423-1 and a single-ended antenna feed line 1424-1. The second patch antenna 1412 is fed with a differential feed line 1423-2 and a single-ended antenna feed line 1424-2. In this regard, each patch antenna 1411 and 1412 can be operated as either a receive antenna or a transmit antenna, while providing polarization diversity.

For example, the differential feed line 1423-1 enables the first patch antenna 1411 to transmit linear-polarized signals in a left-right direction, while the differential feed line 1423-2 enables the second patch antenna 1412 to transmit linear polarized signals in an up-down direction. In a transmit mode of operation, one of the first and second patch antennas 1411 or 1412 can be differentially fed (selectively) to transmit signals in one of the linear-polarized directions (up-down or left-right). Moreover, since the first and second patch antennas 1411 and 1412 are square-shaped, the first and second patch antennas 1411 and 1412 can receive signals that are linear-polarized in either of the two orthogonal directions (up-down and left-right). In addition, the square-shaped first and second patch antennas 1411 and 1412 are capable of receiving circular-polarized signals.

As further shown in FIG. 14, the first ungrounded parasitic ring element 1450 surrounds the first patch antenna 1411 and the second ungrounded parasitic ring element 1452 surrounds the second patch antenna 1412. The first and second ungrounded parasitic ring elements 1450 and 1452 are square-shaped rings that are configured to reduce surface waves along the surface 1012A of the first substrate 1012 in both the up-down and left-right directions. Similar to the ungrounded parasitic patch elements discussed above with reference to FIGS. 12 and 13, each side of the first and second ungrounded parasitic ring elements 1450 and 1452 has a length of L, wherein L is equal to one-half the wavelength within the dielectric (substrate) medium. Moreover, as shown in FIG. 14, each side of the first ungrounded parasitic ring element 1450 is separated from the patch antenna 1411 by a distance (pitch) D, wherein the distance D is at least equal to, or greater than, one-half the free space wavelength of the operating frequency. The same distance (pitch) D is applicable to the spacing between the second patch antenna 1412 and the second ungrounded parasitic ring element 1452.

While the embodiment of FIG. 14 shows the use of ungrounded parasitic ring elements 1450 and 1452, in circumstances wherein there is limited area, ungrounded parasitic patch elements can be used in place of one or both of the ungrounded parasitic ring elements 1450 and 1452 to reduce or eliminate surface waves. For example, in one embodiment, a separate ungrounded parasitic patch element can be disposed adjacent to each critical edge of the first and second patch antennas 1411 and 1412 using techniques as discussed above with reference to FIGS. 12 and 13, for example.

Figure 15:
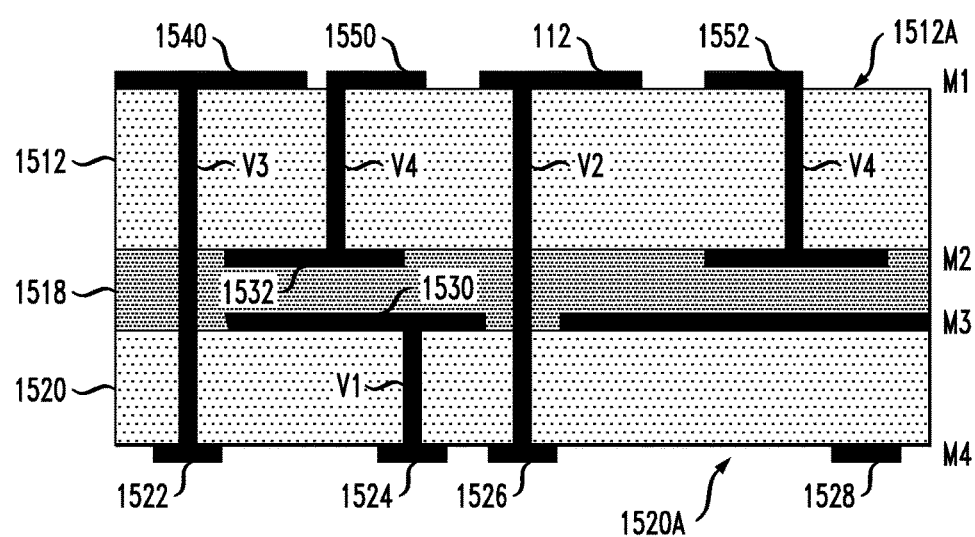
FIG. 15 schematically depicts a stack structure of an antenna package according to another embodiment of the invention, which can be implemented in the wireless communications package structure of FIG. 10.

FIG. 15 schematically depicts an antenna package according to an embodiment of the invention, which can be implemented in the wireless communications package of FIG. 10. More specifically, FIG. 15 is a cross-sectional schematic view of a portion of an antenna package 1510 having a stack of layers comprising a first substrate 1512, an adhesive layer 1518, and a second substrate 1520. In addition, the antenna package 1510 comprises a first metallization layer M1 formed on a upper surface 1512A of the first substrate 1512, a second metallization layer M2 formed on a bottom surface of the first substrate 1512, a third metallization layer M3 formed on an upper surface of the second substrate 1520, and a fourth metallization layer M4 formed on bottom surface 1520A of the second substrate 1520.

In one embodiment of the invention, the first metallization layer M1 comprises one or more planar antenna structures (e.g., patch antenna 112) for receiving or transmitting signals in the broadside radiation, as well as one or more grounded parasitic elements 1550 and 1552 that are configured to improve broadside antenna radiation characteristics by eliminating or reducing the surface waves on the surface 1512A of the first substrate 1512. Various alternative embodiments of antenna packages comprising grounded parasitic elements will be discussed below in further detail with reference to FIGS. 16 and 17, for example.

In addition, in the embodiment of FIG. 15, the first metallization layer M1 comprises one or more power supply patches 1540, which collectively provide a power plane that is configured to distribute DC power to the RFIC chip 1030 from the application board 1040. The embodiment of FIG. 15 is to be contrasted with the embodiment of FIG. 11 in which the second metallization layer M2 is configured as a dedicated power supply plane. However, in the embodiment of FIG. 15, the second metallization layer M2 comprises a capacitively coupled ground plane 1532 which is configured to provide a ground connection for the grounded parasitic elements 1550, 1552 through capacitive coupling to a ground plane 1530 provided by the third metallization layer M3. More specifically, as shown in FIG. 15, the grounded parasitic elements 1550 and 1552 are connected to the capacitively coupled ground plane 1532 using metalized via holes V4. The capacitively coupled ground plane 1532 is AC coupled to the ground plane 1530 through the adhesive layer 1518. This configuration effectively provides a ground connection for the grounded parasitic elements 1550 and 1552 without having to form a partial via hole through the first substrate 1512 and the adhesive layer 1518 to the ground plane 1530 (which would be problematic as discussed below).

Moreover, as discussed above, the ground plane 1530 serves multiple purposes. For example, the ground plane 1530 (i) provides an antenna ground plane for the planar antennas (e.g., patch antenna 112) formed on the first substrate 1512, (ii) provides a ground connection between ground pads on the application board 1040 and ground terminals of circuitry on the RFIC chip 1030, (iii) provides a ground shield to isolate the RFIC chip 1030 from RF energy that is transmitted/received by the broadside antenna(s) 112, and (iv) provides a ground for planar transmission lines (e.g. microstrip lines) that are formed on the surface 1520A of the second substrate 1520 to provide antenna feed lines for the broadside and end fire antenna(s).

As further shown in FIG. 15, the fourth metallization layer M4 comprises a plurality of contact pads 1522, 1524, 1526 and 1528 that serve to electrically and mechanically connect the antenna package 1510 to the RFIC chip 1030 and the application board 1040 as discussed above. For example, the contact pad 1522 is a power supply contact that is connected to a power supply patch 1540 on the surface 1512A of the first substrate 1512 using a metalized via hole V3 that is formed through the layers 1512, 1518 and 1520. The contact pad 1524 is a ground contact that is connected to the ground plane 1530 using a metalized via hole V1 that is formed through the second substrate 1520. The contact pad 1526 is an antenna feed line contact that is connected to the planar antenna 112 using a metalized via hole V2 that is formed through the layers 1512, 1518, and 1520 (wherein the metalized via hole V2 comprises a portion of an antenna feed line). The contact pad 1528 may be a non-electrical contact that merely serves to bond the antenna package 1510 to the RFIC chip 1030 or the application board 1040.

In one embodiment of the invention, the antenna package 1510 can be fabricated using materials and techniques that are the same or similar to those discussed above for the antenna package 1110 embodiment of FIG. 11, for example. The stack structures shown in FIGS. 11 and 15 can be fabricated using standard PCB fabrication technologies. With such technologies, the metallized via holes shown in FIGS. 11 and 15 are formed by drilling via holes completely through one or more substrate/adhesive layers, and then performing a plating process to plate the via holes with copper, for example.

For example, in the embodiment of FIG. 11, package structure 1110 can be fabricated as follows. The third substrate 1020 with the metalized via hole V1 and metallization layer M3 is formed, and then bonded to the second substrate 1016 using the adhesive layer 1018. Thereafter, one or more via holes are drilled down through the second substrate 1016, the adhesive layer 1018, and the third substrate 1020, and the drilled holes are then plated to form the metalized via hole V3. The metallization layer M2 can be formed on the second substrate 1016 before or after the formation of metalized via hole V3. Then, the first substrate 1012 is bonded to the second substrate 1016 using the adhesive layer 1014. Thereafter, one or more via holes are drilled through the first substrate 1012, the adhesive layer 1014, the second substrate 1016, the adhesive layer 1018, and the third substrate 1020, and the drilled holes are then plated to form the metalized via hole V2. Then, the metallization layers M1 and M4 can be formed on the upper and lower surfaces of the stack structure.

In the embodiment of FIG. 11, each of the metalized via holes V1, V2 and V3 are formed by drilling completely through a partially or fully completed stack structure followed by a metal plating process. While the embodiment of FIG. 11 comprises ungrounded parasitic elements 1150 on the first metallization layer M1, it would be problematic to fabricate grounded parasitic elements on the first metallization layer M1 in the stack structure of FIG. 11. This would require the formation of "partial" via holes by drilling holes partially through the stack structure starting from the first substrate 1012 down to the ground plane 1130. With standard PCB fabrication processes, the formation of partial via holes is problematic and difficult. For example, it is difficult to control the drilling process to stop at a precise point (e.g., at the ground plane 1130) within the stack structure, which can lead to failed connections. Moreover, in the embodiment of FIG. 11, the formation of partial vias to the ground plane 1130 could result in damage to the ground plane 1130.

In contrast, the stack structure 1510 shown in FIG. 15 enables ground connections between the parasitic elements 1550 and 1552 and the ground plane 1530 without having to form partial vias. For example, package structure 1510 can be fabricated as follows. The first and second substrates 1512 and 1520 are separately formed, wherein the first substrate 1512 is initially formed with the capacitively coupled ground plane 1532 (metallization layer M3) and the metalized via holes V4, and wherein the second substrate 1520 is initially formed with the ground plane 1530 (metallization layer M3) and the metalized vial hole V1. Then, the first and second substrates 1512 and 1520 are bonded together using the adhesive layer 1518. Thereafter, one or more via holes are drilled through the first substrate 1512, the adhesive layer 1518, and the second substrate 1520, and the drilled holes are then plated to form the metalized via holes V2 and V3. Then, the metallization layers M1 and M4 can be formed on the upper and lower surfaces of the stack structure 1510.

Figure 16:
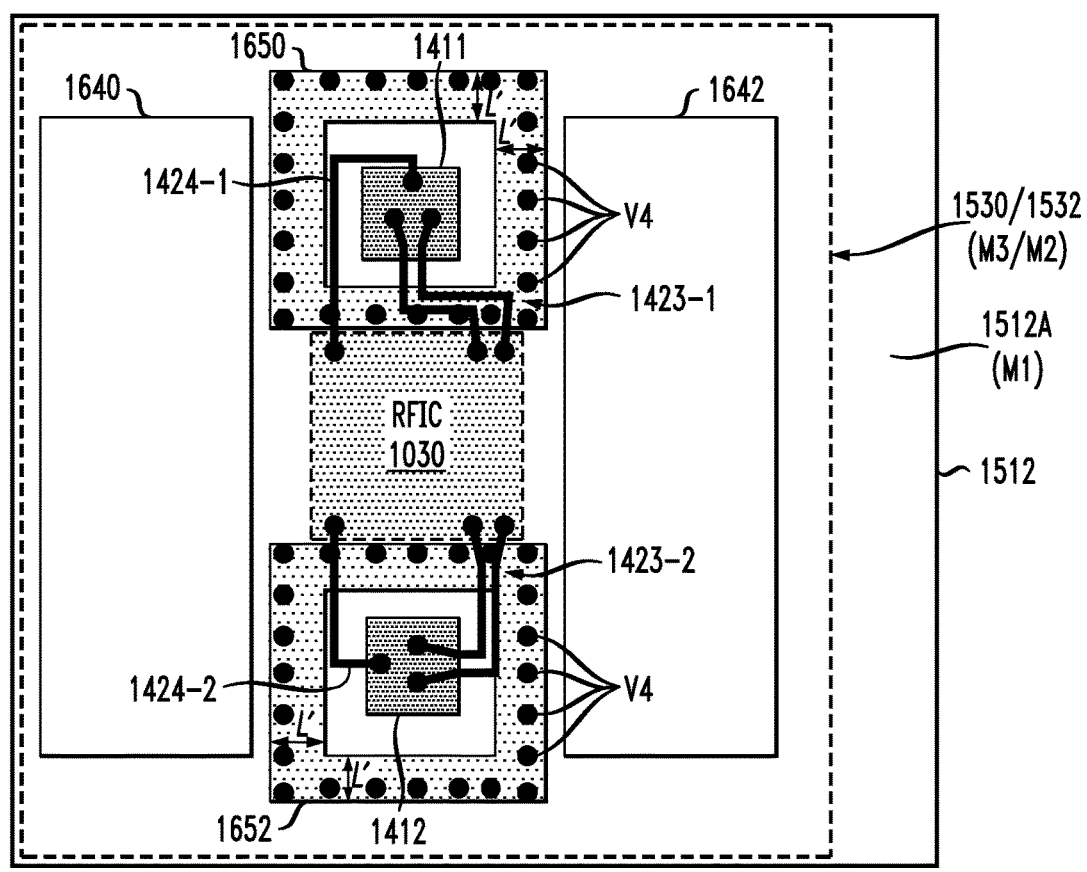
FIG. 16 schematically depicts an antenna package according to an embodiment of the invention, which is implemented based on the stack structure of FIG. 15.

FIG. 16 schematically depicts an antenna package according to an embodiment of the invention, which is implemented based on the stack structure of FIG. 15. More specifically, FIG. 16 is a schematic plan view of an antenna package 1600 which comprises a broadside patch antenna configuration (1411 and 1412) and feed line configuration (1423-1, 1423-2, 1424-1, and 1424-2) formed on the upper surface 1512A of the first substrate 1512, which are similar to the antenna/feed line configurations of the embodiment of the antenna package 1400 of FIG. 14 to provide polarization diversity.

The antenna package 1600 further comprises a first grounded parasitic ring element 1650 surrounding the first patch antenna 1411, a second grounded parasitic ring element 1652 surrounding the second patch antenna 1412, and a plurality of power supply patches 1640 and 1642, which are all disposed on the upper surface 1512A of the first substrate 1512. For ease of illustration, the end-fire antenna structures are not shown in FIG. 16.

Similar to the ungrounded parasitic ring elements 1450 and 1452 in FIG. 14, the first and second grounded parasitic ring elements 1650 and 1652 are square-shaped rings that are configured to reduce surface waves along the surface 1512A of the first substrate 1512 in both the up-down and left-right directions. Each of the first and second grounded parasitic ring elements 1650 and 1652 are connected to the capacitively coupled ground plane 1532 using an array of metalized via holes V4 (and thereby connected to the ground plane 1530 via AC coupling). Due to the grounding, each side of the first and second grounded parasitic ring elements 1650 and 1652 has a length L' equal to one-quarter the wavelength within the dielectric (substrate) medium. Similar to the ungrounded parasitic ring elements 1450 and 1452 in FIG. 14, each side of the first and second grounded ring elements 1650 and 1652 is separated from the respective patch antenna 1411 and 1412 by a distance (pitch) D, wherein the distance D is at least equal to, or greater than, one-half the free space wavelength of the operating frequency.

While the embodiment of FIG. 16 shows the use of grounded parasitic ring elements 1650 and 1652, in circumstances where there is limited area, grounded parasitic patch elements can be used in place of one or more of the grounded parasitic ring elements 1650 and 1652 for one or more of the patch antennas, such as shown in the following embodiment of FIG. 17.

Figure 17:
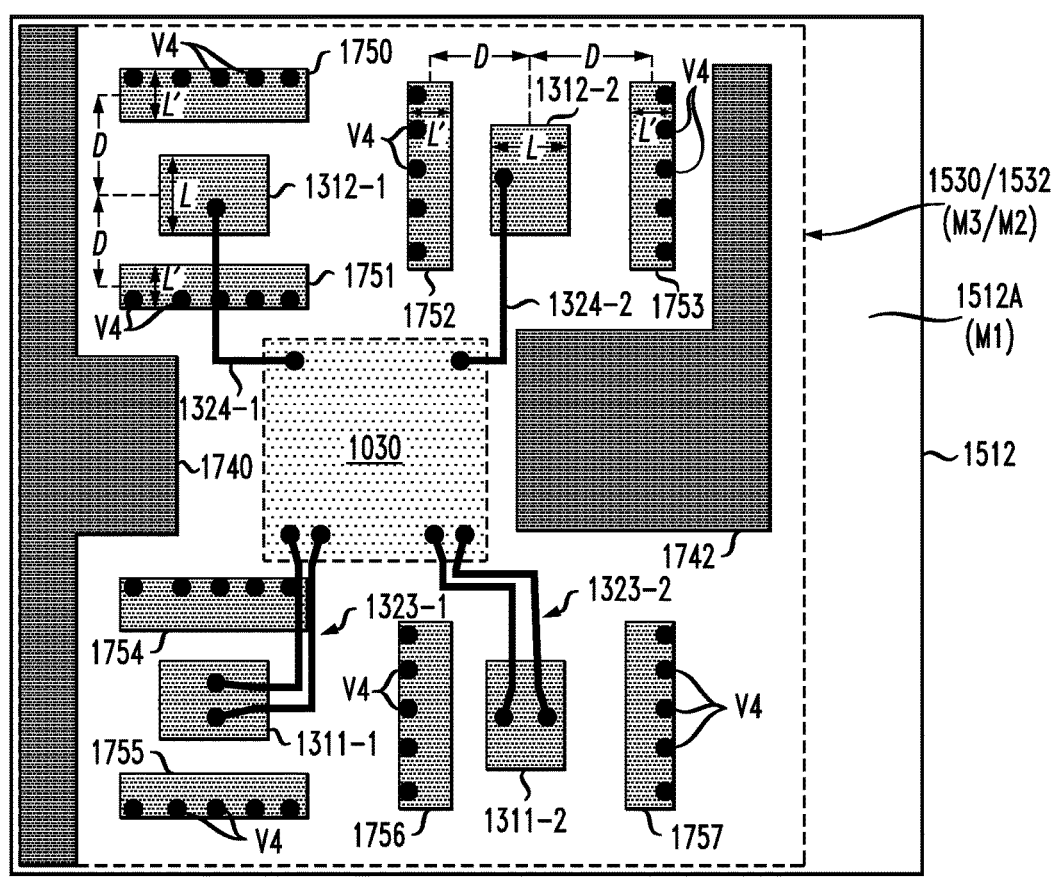
FIG. 17 schematically depicts an antenna package according to another embodiment of the invention, which is implemented based on the stack structure of FIG. 15.

FIG. 17 schematically depicts an antenna package according to an embodiment of the invention, which is implemented based on the stack structure of FIG. 15. More specifically, FIG. 17 is a schematic plan view of an antenna package 1700 which comprises a broadside patch antenna configuration (1311-1, 1311-2, 1312-1, 1312-2) and feed line configuration (1323-1, 1323-2, 1324-1, 1324-2) formed on the upper surface 1512A of the first substrate 1512, which is the same as the antenna/feed line configurations of the antenna package 1300 of FIG. 13 to provide polarization diversity. The antenna package 1700 further comprises a plurality of grounded parasitic patch elements 1750, 1751, 1752, 1753, 1754, 1755, 1756 and 1757, and a plurality of power supply patches 1740 and 1742, which are all disposed on the upper surface 1512A of the first substrate 1512. For ease of illustration, the end-fire antenna structures are not shown in FIG. 17.

The grounded parasitic patch elements 1750 and 1751 are disposed adjacent to the critical edges of the receive patch antenna 1312-1 (which define its length L) to reduce or eliminate surface waves that are generated in the up-down direction of the drawing. The grounded parasitic patch elements 1752 and 1753 are disposed adjacent to the critical edges of the receive patch antenna 1312-2 (which define its length L) to reduce or eliminate surface waves that are generated in the left-right direction of the drawing. The grounded parasitic patch elements 1754 and 1755 are disposed adjacent to the critical edges of the transmit patch antenna 1311-1 (which define its length L) to reduce or eliminate surface waves that are generated in the up-down direction of the drawing. The grounded parasitic patch elements 1756 and 1757 are disposed adjacent to the critical edges of the transmit patch antenna 1311-2 (which define its length L) to reduce or eliminate surface waves that are generated in the left-right direction of the drawing.

Each of the grounded parasitic patch elements 1750, 1751, 1752, 1753, 1754, 1755, 1756 and 1757 are connected to the capacitively coupled ground plane 1532 using an array of metalized via holes V4 (and thereby connected to the ground plane 1530 via AC coupling). Due to the grounding, each of the grounded parasitic patch elements 1750, 1751, 1752, 1753, 1754, 1755, 1756 and 1757 has a length L' equal to one-quarter the wavelength within the dielectric (substrate) medium. Moreover, each of the grounded parasitic patch elements 1750, 1751, 1752, 1753, 1754, 1755, 1756 and 1757 is separated from the respective patch antenna 1311-1, 1311-2, 1312-1, 1312-2 by a distance (pitch) D, wherein the distance D is at least equal to, or greater than, one-half the free space wavelength of the operating frequency.

While the embodiment of FIG. 17 shows the use of grounded parasitic patch elements, in circumstances wherein there is enough area, grounded parasitic ring elements as shown in FIG. 16 can be used in place of the grounded parasitic patch elements for one or more of the patch antennas 1311-1, 1311-2, 1312-1, 1312-2 to reduce or eliminate surface waves.

Moreover, as shown in FIGS. 16 and 17, the power supply patches 1640/1642 and 1740/1742 can occupy are relatively large area on the surface 1512A of the first substrate 1512 without affecting antenna performance, while at the same time providing a low loss, low inductance power plane that enables the distribution of DC supply voltage from the application board to the RFIC chip.

Those of ordinary skill in the art will readily appreciate the various advantages associated with integrated chip/antenna package structures according to embodiments of the invention. For instance, an antenna package structure can be readily fabricated using known PCB manufacturing and packaging techniques to fabricate and package antenna structures with semiconductor RFIC chips to form compact integrated radio/wireless communications systems for millimeter wave applications with radiations in the broadside and end-fire directions. Moreover, integrated chip packages according to embodiments of the invention enable antennas to be integrally packaged with IC chips such as transceiver chips, which provide compact designs with very low loss between the transceiver and the antenna.

Moreover, various types of antenna designs can be implemented as discussed above to transmit and/or receive broadside and end-fire radiation. Although embodiment of antenna packages discussed herein depict two or three substrates, antenna packages can be constructed with four or more substrates, depending on the intended application. Moreover, although the embodiments discussed herein show the use of two or four antennas for broadside and end-fire radiations, additional antenna elements can be included to achieve increased antenna gain or to implement phased array antenna structures.

It is to be further understood that the antenna package structures illustrated herein can extended or varied depending on the application, e.g., antenna structure, I/O routing requirements, power and ground plane requirements, etc. Those of ordinary skill in the art readily understand that the antenna performance parameters such as antenna radiation efficiency and bandwidth and operating resonant frequency will vary depending on the dielectric constant, loss tangent, and thickness of the dielectric/insulating materials that form the substrate layers. Moreover, the size and structure of the various radiating elements of the antennas shown in drawings will determine the resonant frequency of the antenna, as is well understood to those of ordinary skill in the art.

Although embodiments have been described herein with reference to the accompanying drawings for purposes of illustration, it is to be understood that the present invention is not limited to those precise embodiments, and that various other changes and modifications may be affected herein by one skilled in the art without departing from the scope of the invention.

We Claim:

1. An antenna package, comprising:
a first substrate;
a second substrate bonded to the first substrate using an adhesive layer;
wherein the first substrate comprises a first metallization layer disposed on a first surface of the first substrate and a second metallization layer disposed on a second surface of the first substrate,
wherein the first metallization layer comprises a first planar antenna, and a grounded planar parasitic element disposed adjacent to the first planar antenna, wherein the first planar antenna is configured to receive or transmit broadside signals, wherein the grounded planar parasitic element is configured to reduce surface waves on the surface of the first substrate, and wherein the second metallization layer comprises a capacitively coupled ground plane;
wherein the second substrate comprises a third metallization layer disposed on a first surface of the second substrate, wherein the third metallization layer comprises a dedicated ground plane, wherein the capacitively coupled ground plane is coupled to the dedicated ground plane through the adhesive layer;
wherein the second substrate comprises a fourth metallization layer formed on second surface of the second substrate, wherein the fourth metallization layer comprises a plurality of contact pads, one or more antenna feed lines, and a second planar antenna, wherein the second planar antenna is configured to transmit or receive end-fire signals;
a plurality of metalized via holes formed through the first and second substrates to provide one or more antenna feed lines from contact pads of the fourth metallization layer to the first planar antenna, and to provide connections from contact pads of the fourth metallization layer to the power supply patch of the first metallization layer;

a plurality of metalized via holes formed through the first substrate to provide connections from the grounded planar parasitic element of the first metallization layer to the capacitively coupled ground plane of the second metallization layer; and a plurality of metalized via holes formed through the second substrate to provide connections from contact pads of the fourth metallization layer to the ground plane of the third metallization layer.

2. The antenna package of claim 1, wherein the first and second substrates are printed circuit boards that are each formed from a hydrocarbon ceramic laminate.

3. The antenna package of claim 1, wherein the grounded planar parasitic element comprises a grounded patch element disposed adjacent to a critical edge of the first planar antenna.

4. The antenna package of claim 1, wherein the grounded planar parasitic element comprises a grounded parasitic ring element that surrounds the first planar antenna.

5. The antenna package of claim 1, wherein the first metallization layer comprises a power supply patch which is configured to distribute a DC power supply voltage.

* * * * *